US008710561B2

(12) United States Patent
Ichikawa et al.

(10) Patent No.: US 8,710,561 B2
(45) Date of Patent: Apr. 29, 2014

(54) PIXEL STRUCTURE OF A SOLID-STATE IMAGE SENSOR EMPLOYING A CHARGE SORTING METHOD

(75) Inventors: Michinori Ichikawa, Tokyo (JP); Takanori Tanite, Tokyo (JP); Tadashi Kawata, Tokyo (JP); Ryohoi Ikono, Tokyo (JP)

(73) Assignees: Brainvision Inc., Tokyo (JP); Stanley Electric Co., Ltd., Tokyo (JP)

( * ) Notice: Subject to any disclaimer, the term of this patent is extended or adjusted under 35 U.S.C. 154(b) by 941 days.

(21) Appl. No.: 12/463,622

(22) Filed: May 11, 2009

(65) Prior Publication Data

US 2009/0278174 A1 Nov. 12, 2009

(30) Foreign Application Priority Data

May 12, 2008 (JP) .................................. 2008-125309

(51) Int. Cl.
*H01L 31/062* (2012.01)

(52) U.S. Cl.
USPC .................... 257/292; 257/291; 257/E27.133

(58) Field of Classification Search
USPC ............................ 257/247, 291, 292, E27.133
See application file for complete search history.

(56) References Cited

U.S. PATENT DOCUMENTS

| 5,675,158 A * | 10/1997 | Lee ................................ 257/233 |
| 7,888,716 B2 * | 2/2011 | Ichikawa et al. ............... 257/292 |
| 2006/0090028 A1 * | 4/2006 | Anthony et al. .............. 711/100 |
| 2006/0145212 A1 * | 7/2006 | Hyun ............................. 257/292 |
| 2006/0214194 A1 * | 9/2006 | Ikeda ............................ 257/215 |
| 2007/0176213 A1 * | 8/2007 | Oda ............................... 257/247 |
| 2008/0225152 A1 * | 9/2008 | Tsunai .......................... 348/311 |
| 2008/0296639 A1 * | 12/2008 | O .................................. 257/291 |
| 2009/0057673 A1 * | 3/2009 | Ichikawa et al. ................ 257/59 |

FOREIGN PATENT DOCUMENTS

JP 2005235893 A * 9/2005 ............. H01L 27/14

* cited by examiner

*Primary Examiner* — Allen Parker
(74) *Attorney, Agent, or Firm* — Birch, Stewart, Kolasch & Birch, LLP

(57) ABSTRACT

A pixel structure of a solid-state image sensor in which residual electrons in a photodiode is reduced and which has a first-stage gate that is arranged adjacent to the photodiode and controls read-out of electrons generated in the photodiode, a second-stage gate that is adjacent to the first-stage gate on the rear stage of the gate at a predetermined gap and controls movement of electrons read out by the readout control of the first-stage gate to the plurality of the charge-storage sections, and a plurality of third-stage gates that are adjacent to the second-stage gate on the rear stage of the gate at a predetermined gap, severally arranged corresponding to the plurality of the charge-storage sections, and perform control of distributing the electrons moved by the movement control of the second-stage gate severally to the plurality of the charge-storage sections, and gradient on which electrons are moved in the first-stage gate direction is formed on the potential of the photodiode.

10 Claims, 17 Drawing Sheets

FIG. 1 (a)

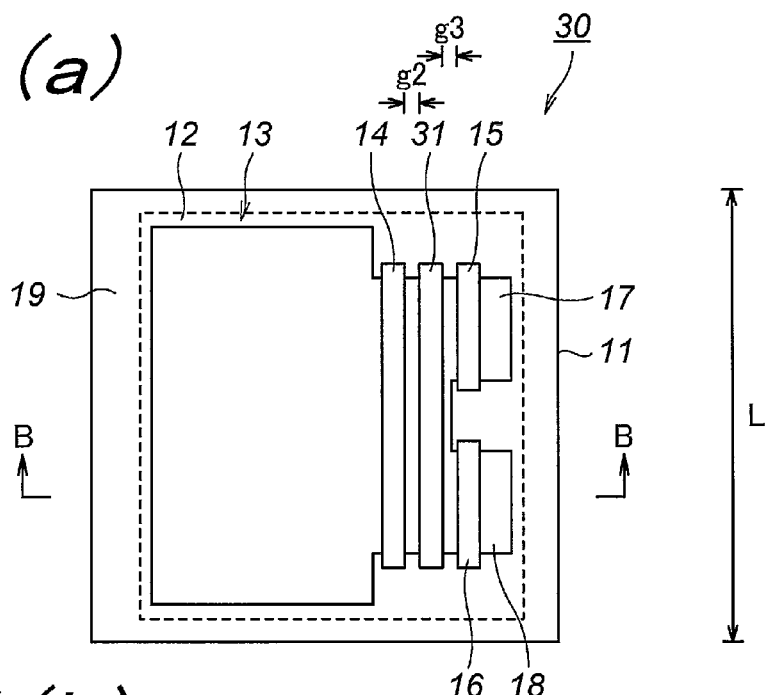

FIG. 1 (b)

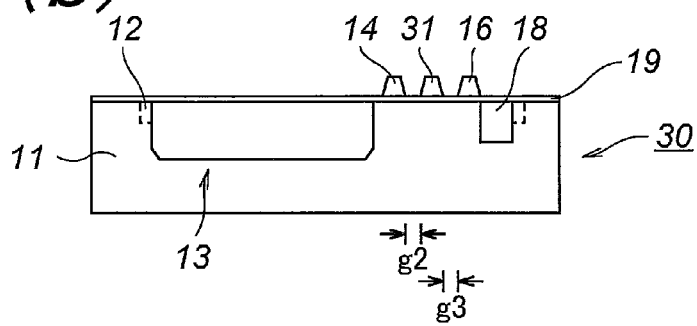

11 : SUB : SUBSTRATE (P-)
12 : STI : SEPARATION TRENCH (STI)
13 : PD : PHOTODIODE (N-): PINNING STRUCTURE
14 : TG : TRANSFER GATE (READ-OUT GATE)(POLY)
15 : DG1 : FIRST DISTRIBUTION GATE (POLY)
16 : DG2 : SECOND DISTRIBUTION GATE (POLY)
17 : FD1 : FIRST CHARGE-STORAGE SECTION (N+)
18 : FD2 : SECOND CHARGE-STORAGE SECTION (N+)
19 : SOX : SILICON OXIDE FILM (SOX)
31 : SG : SUB-TRANSFER GATE (MOVEMENT GATE) (POLY)

N− : N TYPE IMPURITY LOW-CONCENTRATION DOPED REGION
N+ : N TYPE IMPURITY HIGH-CONCENTRATION DOPED REGION
P− : P TYPE IMPURITY LOW-CONCENTRATION DOPED REGION

SOX : SILICON OXIDE FILM
POLY : POLYSILICON

SOLID LINE ———— : POLYSILICON REGION
DASHED LINE ----- : ACTIVE REGION

- SOX : SILICON OXIDE FILM
- N+ : N TYPE IMPURITY HIGH-CONCENTRATION DOPED REGION
- N− : N TYPE IMPURITY LOW-CONCENTRATION DOPED REGION
- P− : P TYPE IMPURITY LOW-CONCENTRATION DOPED REGION
- PW : P TYPE IMPURITY MIDDLE-CONCENTRATION DOPED REGION

ARROW A: ELECTRON MOVEMENT IN PHOTODIODE
ARROW B: PASSING THROUGH FIRST-STAGE GATE
(READ-OUT GATE)
ARROW C: PASSING THROUGH SECOND-STAGE GATE
(MOVEMENT GATE)
ARROW D: PASSING THROUGH THIRD-STAGE GATE
(DISTRIBUTION GATE)
(CASE OF MOVING ON SHORTEST DISTANCE)
ARROW E: PASSING THROUGH THIRD-STAGE GATE
(DISTRIBUTION GATE)
(CASE OF MOVING ON LONGEST DISTANCE)

FIG. 8

SOLID LINE ———— : POLYSILICON REGION
DASHED LINE ------ : ACTIVE REGION
GRAY REGION ▨ : P TYPE IMPURITY MIDDLE-CONCENTRATION DOPED REGION

- SOX : SILICON OXIDE FILM
- N+ : N TYPE IMPURITY HIGH-CONCENTRATION DOPED REGION
- N− : N TYPE IMPURITY LOW-CONCENTRATION DOPED REGION
- P− : P TYPE IMPURITY LOW-CONCENTRATION DOPED REGION
- PW : P TYPE IMPURITY MIDDLE-CONCENTRATION DOPED REGION

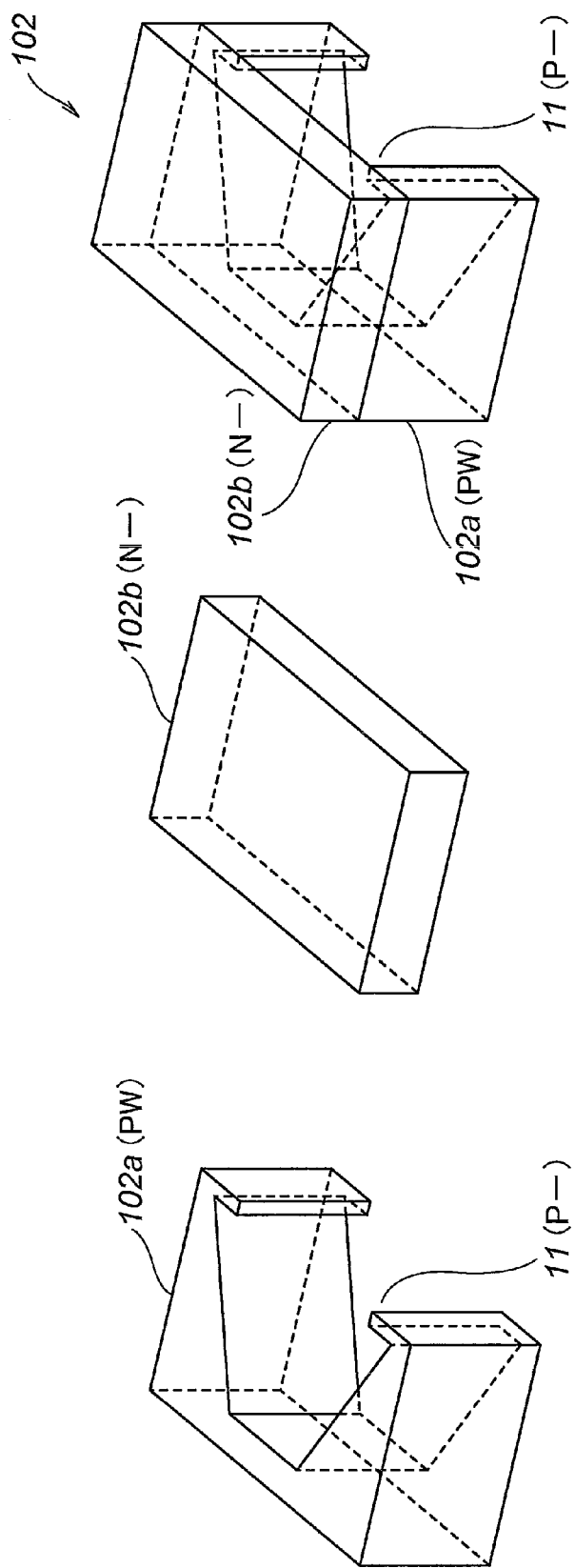

SOLID LINE ——— : POLYSILICON REGION
DASHED LINE ------ : ACTIVE REGION
GRAY REGION ▨ : P TYPE IMPURITY MIDDLE-CONCENTRATION DOPED REGION
SHADED REGION : REGION WHERE ELECTRONS EXIST

SOLID LINE ———— : POLYSILICON REGION
DASHED LINE ------ : ACTIVE REGION
GRAY REGION ▨ : P TYPE IMPURITY MIDDLE-CONCENTRATION DOPED REGION
SHADED REGION : REGION WHERE ELECTRONS EXIST

SOLID LINE ——— : POLYSILICON REGION
DASHED LINE ------ : ACTIVE REGION
GRAY REGION : P TYPE IMPURITY MIDDLE-CONCENTRATION DOPED REGION
SHADED REGION : REGION WHERE ELECTRONS EXIST

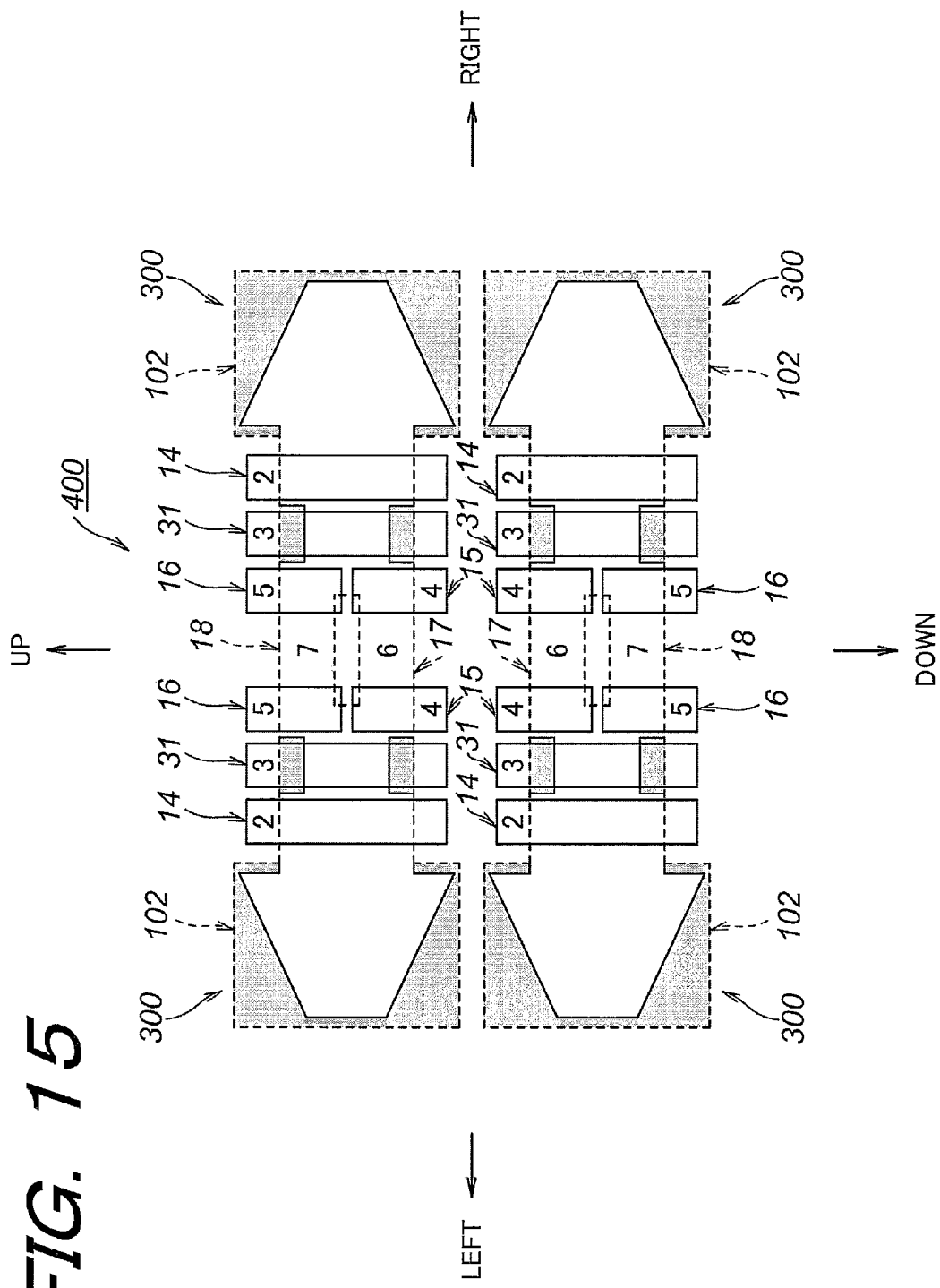

SOLID LINE ———— : POLYSILICON REGION
DASHED LINE ------ : ACTIVE REGION
GRAY REGION ▨ : P TYPE IMPURITY MIDDLE-CONCENTRATION DOPED REGION

PIXEL STRUCTURE OF A SOLID-STATE IMAGE SENSOR EMPLOYING A CHARGE SORTING METHOD

BACKGROUND OF THE INVENTION

1. Field of the Invention

The present invention relates to a pixel structure of a solid-state image sensor, more particularly to the improvement of pixels that constitute a solid-state image sensor that can be used as a time-of-light-flight distance sensor, which measures optical time-of-flight by using an optical time-of-flight measurement method (TOF: Time of flight) by receiving reflection light of light irradiated to an object and measures a distance to the object based on the optical time-of-flight, an image sensor that obtains a three-dimensional image of the object, or the like. Particularly, the invention relates to a pixel structure of a solid-state image sensor that can be used as a pixel of a solid-state image sensor employing a charge sorting method which can be used under unknown background light illumination such as a solid-state image sensor that is equipped with a plurality of charge-storage sections and discriminate photoelectrons generated by incoming light on the timing of incoming light to sort and store the photoelectrons in the plurality of charge-storage sections.

2. Description of the Related Art

Generally, there is known a so-called optical time-of-flight measurement method (TOF: Time of flight) in which intensity-modulated illumination light by pulse or high frequency is irradiated on an object, time-of-flight until the reflection light from the object reaches an image sensor is measured to obtain distance.

As a solid-state image sensor that can be used as an image sensor used in the optical time-of-flight measurement method, there is a sensor employing a charge sorting method, for example, which is equipped with a photoelectric conversion section and a plurality of charge-storage sections, discriminates electrons generated in the photoelectric conversion section by the incoming light on timing of incoming light, and sorts and stores the discriminated electrons in the plurality of charge-storage sections.

Meanwhile, according to the solid-state image sensor employing the charge sorting method, conventionally, the processing of distributing electrons generated in the photoelectric conversion section to a plurality of charge-storage sections in response to incoming timing of light has been realized by applying a high-frequency pulse voltage to gate electrodes installed directly above the oxide film on semiconductor surface.

However, due to multiple reasons such as concentration variation in impurity to be doped in a semiconductor substrate near the gate electrodes, instability of the physical shape of the gate electrodes, damage of the oxide film or variation in the film thickness, even if each gate electrode is equipped with the same structure and the same voltage is applied to each gate electrode, there is generally a fear that passages (channels) of electrons formed on the semiconductor substrate of directly under each gate electrode do not become entirely the same, and there is a fear that channels formed directly under gate electrodes are differently formed between each gate and variation occurs.

If variation occurs in the channels formed directly under each gate electrode, electrons that should be distributed to a plurality of charge-storage sections in the same conditions are partially distributed to a charge-storage section adjacent to a gate electrode having a low threshold value, and a problem was pointed out that electrons generated in the photoelectric conversion section could not be distributed correctly to the charge-storage sections.

Conventionally, to solve the problems regarding the distribution of electrons generated in the photoelectric conversion section, a method is proposed in which a photogate structure is employed in the photoelectric conversion section, is charge residue eliminated by the structure and a potential difference exceeding variation in a threshold value of the gate is generated as disclosed in Japanese Patent Laid-open No. 2005-235893 that was presented as Patent Document 1, for example.

However, it is known that the photoelectric conversion efficiency of the photogate is low to light having long wavelength, and for this reason, a new problem incurred in a solid-state image sensor employing a photogate structure in the photoelectric conversion section that a large obstacle in applying to various applications.

For this reason, in view of the various problems that Prior Art has, the present inventor proposed an invention according to the pixel structure of a solid-state image sensor as patent application No. 2007-181696 (filing date: Jul. 11, 2007) that the pixel structure of solid-state image sensor of charge sorting method which distributes electrons used in an optical time-of-flight measurement method or the like to perform charge storage, in which imbalance in the distribution of electrons caused by the variation in a threshold value voltage of a gate for distributing electrons is eliminated, and a photodiode having sensitivity in long wavelength can be used as a photoelectric conversion element.

The invention that the present inventor proposed by Patent Application No. 2007-181696 is that sorting performance of electrons is improved by constituting the gates for distributing electrons in multistage, and they can be used as pixels of the solid-state image sensor which are used in an optical time-of-flight measurement method or the like, more particularly, by changing the structure of gates adjacent to a plurality of charge-storage sections in which variation in a threshold value affects the distribution of electrons generated in the photoelectric conversion section becomes a problem, the variation in the threshold value is prevented from affecting electron sorting capability.

More specifically, the invention that the present inventor proposed by Patent Application No. 2007-181696 is that a front stage gate that performs readout control of photodiode and a rear stage gate that is positioned on the rear stage of this front stage gate and performs control of distributing electrons to a charge-storage section are provided, and by giving a difference of potential exceeding the threshold value variation that the rear stage gate, which performs control of distributing electrons to the charge-storage section, has by the front stage gate the threshold value variation in the rear stage gate that performs distribution of electrons is prevented from affecting the distribution of electrons to the charge-storage section.

Herein, FIG. 1(a) shows a plane structure explanatory view schematically illustrating a principled plane structure of the pixel structure of the solid-state image sensor according to the second embodiment of the invention proposed by Patent Application No. 2007-181696, and FIG. 1(b) shows a cross-sectional structure explanatory view schematically illustrating a principled cross-sectional structure of FIG. 1(a) along B-B line.

When the pixel structure of a solid-state image sensor 30 according to the second embodiment of the invention proposed by Patent Application No. 2007-181696 which is shown in FIGS. 1(a) (b) is compared with a conventional pixel structure of a solid-state image sensor, this pixel structure 30 is different from the conventional pixel structure on the point that a transfer gate (TG) 14 being a read-out gate that is a first-stage gate (front stage gate), which performs readout control of a photodiode (PD) 13 that receives light and generates electrons by photoelectric conversion, and distribution gates (DG) (in pixel structure 30, two distribution gates of a first distribution gate (DG1) 15 and a second distribution gate (DG2) 16 are provided as distribution gates) being third-stage gates (rear stage gate) that are positioned on the rear stage of the transfer gate 14 (hereinafter, should be referred to as "read-out gate 14") and perform control of distributing electrons to charge-storage sections (FD) (in the pixel structure 30, two charge-storage sections of a first charge-storage section (FD1) 17 and a second charge-storage section (FD2) 18 are provided as the charge-storage sections) are adjacently disposed, and a sub-transfer gate (SG) 31 being movement gate, which is the second-stage gate, is disposed between the read-out gate 14 being the first-stage gate, and the first distribution gate 15 and the second distribution gate 16 being the third-stage gates as a middle gate.

More specifically, the photodiode 13 that takes a wide area in the pixel structure 30 and the read-out gate 14 being the first-stage gate are adjacently arranged, the first distribution gate 15 and the second distribution gate 16 that are a plurality (two in this embodiment) of third-stage gates are adjacently arranged to the read-out gate 14 with a sub-transfer gate 31 being the second-stage gate (hereinafter, should be referred to as "movement gate 31"), and a plurality (which is two because distribution gates are two in this embodiment) of the first charge-storage section 17 and the second charge-storage section 18 corresponding to each distribution gate are respectively arranged adjacent to the first distribution gate 15 and the second distribution gate 16.

Herein, it is preferable that a gap g2 between the read-out gate 14 and the movement gate 31 adjacent to the gate and a gap g3 between the movement gate 31 and plural numbers of the distribution gates (the first distribution gate (DG1) 15 and the second distribution gate (DG2)) adjacent to the gate be as small as possible, and for example, in the case where these gates are gates formed in a polysilicon layer of the same layer, it is preferable to set the gap g2 and the gap g3 to about 0.2 to 0.3 μm that is a minimum value restricted by manufacturing rules, for example.

On the other hand, in the case where these gates are gates formed in different polysilicon layers, the minimum gap created by interface between different polysilicon layers automatically satisfies the conditions of the gap g2 and the gap g3. For this reason, the read-out gate 14 and the movement gate 31 can be constituted so as to have a slightly overlapped region, and the movement gate 31, the first distribution gate 15 and the second distribution gate 16 can be constituted so as to have a slightly overlapped region.

Further, the periphery of each element of the photodiode 13, the read-out gate 14, the movement gate 31, the first distribution gate 15, the second distribution gate 16, the first charge-storage section 17 and the second charge-storage section 18 is separated from a substrate (SUB) 11 by a separating trench (STI) 12.

Next, referring to FIG. 1(b), description will be made for a case where a P type semiconductor substrate is used as the substrate 11 and a solid-state image sensor of the pixel structure 30 is constituted on the substrate 11 composed of this P type semiconductor substrate.

More specifically, in this case, the photodiode 13 is formed by doping low-concentration N type impurity, and the photodiode is formed so as to expand sensitivity on a long wavelength side by making an ion implantation depth rather thick.

Further, the first charge-storage section 17 and the second charge-storage section 18 are drains formed by doping high-concentration N type impurity.

Herein, the doping of N type impurity can be generally formed by a so-called self-alignment method in which ion implantation is performed after forming silicon oxide film (SOX) 19, the polysilicon read-out gate 14, the movement gate 31, the first distribution gate 15 and the second distribution gate 16 on the substrate 11.

At this point, it is necessary to mask a gap between the read-out gate 14, the movement gate 31, the first distribution gate 15 and the second distribution gate 16 to prevent the gap from being doped by N type impurity.

As a result, the gap between the read-out gate 14, the movement gate 31, the first distribution gate 15 and the second distribution gate 16 is formed in the state of the P type semiconductor substrate as it is, that is, to be a native channel.

Herein, a reason why the gap between the read-out gate 14, the movement gate 31, the first distribution gate 15 and the second distribution gate 16 is formed as the native channel is as follows.

More specifically, in the pixel structure 30, it is necessary that potential of the gap between each gate be controlled by a voltage applied to an adjacent gate and a channel of continuous potential be formed, and its simplest method is forming it as the native channel. However, if the potential of a gap between each gate is controlled by a voltage applied to an adjacent gate and the channel of continuous potential is formed, it goes without saying that appropriate impurity may be doped in the gap between each gate.

It is to be noted that each element of the photodiode 13, the read-out gate 14, the movement gate 31, the first distribution gate 15, the second distribution gate 16, the first charge-storage section 17 and the second charge-storage section 18, as described above referring to FIGS. 1(a) (b), is generally formed on the P type semiconductor substrate, but not limited to the P type semiconductor substrate and it goes without saying that it may be formed on a P well (PW) that is formed by doping P type impurity at middle concentration.

Further, it goes without saying that an N type semiconductor substrate may be used as the substrate 11 and all the P type and the N type of each element are inverted as described above, and each element may be formed on the N type semiconductor substrate, and similarly, each element may be formed on an N well.

Although an appropriate size can be arbitrarily selected for the size of the solid-state image sensor in response to an object or an application, a square having a length L of one side at about 10 μm to 75 μm, more specifically, about 10 μm squares to about 75 μm squares is practical as the entire size of the pixel 30.

Further, the gate length of each gate should be optimized based on substrate impurity concentration, oxide film thickness, and conformity of forming channel by an applied voltage, and about 0.5 μm to 1.5 μm is appropriate, for example.

Next, referring to FIGS. 2(a) (b) (c) (d), description will be made for potential in semiconductor and the movement of electrons generated in the photodiode 13.

FIGS. 2(a) (b) (c) (d) are explanatory views schematically illustrating potential in semiconductor corresponding to each element in the cross-sectional explanatory view shown in FIG. 1(b) when a voltage is applied to the read-out gate 14, the movement gate 31, the first distribution gate 15 and the second distribution gate 16.

It is to be noted that square figures illustrated directly above the potential in FIGS. 2(a) (b) (c) (d) show the read-out gate 14 for "TG", the movement gate 31 for "SG", the distribution gate (means either one of the first distribution gate 15 or the second distribution gate 16) for "DG", in which a state where the square is in outline shows that electric potential near substrate potential Vss is given, and on the other hand, a state where the square is painted out in black shows that positive potential is applied.

In the three-stage gate structure by the pixel structure 30, in which the movement gate 31 being the second-stage gate is provided between the read-out gate 14 being the first-stage gate and the distribution gates being the third-stage gates (the first distribution gate 15 and the second distribution gate), a voltage near substrate potential Vss or a voltage Vtg is applied to the read-out gate 14, the voltage near the substrate potential Vss or a power source voltage Vdd is applied to the movement gate 31, and the voltage near the substrate potential Vss or a voltage Vdg is applied to the distribution gate (DG) (the first distribution gate 15 or the second distribution gate 16).

It is preferable to optimize the voltage Vtg and the voltage Vdg as described below.

More specifically, since a voltage creating sufficient potential gradient to the power source voltage Vdd is desirable as the voltage Vtg, about ½ the power source voltage Vdd is acceptable. Further, it is desirable that the voltage Vdg be near the substrate potential Vss because its voltage difference from the power source voltage Vdd is proportional to the number of storable electrons, and about ⅓ the power source voltage Vdd is desirable because potential gradient in moving electrons should also be taken in consideration.

Specifically, it is preferable to set the voltage Vtg and the voltage Vdg to 1.8V and 1.0V respectively, for example, when the power source voltage Vdd is 3.3V.

Herein, FIGS. 2(a) (b) (c) (d) show methods of moving electrons in the four states shown in FIG. 2(a), FIG. 2(b), FIG. 2(c) and FIG. 2(d) by potential.

It is to be noted that the four states are a basic state (a state of electron storage) shown in FIG. 2(a), a state of electron transfer shown in FIG. 2(b), a state of separating valley of potential shown in FIG. 2(c), and a state of re-transferring electrons shown in FIG. 2(d) as described below.

More specifically, the basic state is the state of electron storage being a state where electric potential near the substrate potential Vss is given to the read-out gate 14, the movement gate 31 and the distribution gates, the photodiode 13 is reset to the voltage Vtg, and the charge-storage section is reset to the power source voltage Vdd. FIG. 2(a) shows this basic state (state of electron storage).

When exposed to light in the basic state shown in this FIG. 2(a), photoelectrons are stored in the photodiode 13 and the potential of the photodiode 13 slightly rises.

Next, when the voltage Vtg is applied to the read-out gate 14 and the power source voltage Vdd is applied to the movement gate 31, potential directly under the read-out gate 14 and the movement gate 31 is pushed down, and electrons move to a valley of potential created directly under the movement gate 31 (state of electron transfer) as shown in FIG. 2(b).

Next, when electric potential near the substrate potential Vss is given to the read-out gate 14 to return the voltage, the power source voltage Vdd is kept applied to the movement gate 31, and the voltage Vdg is applied to the distribution gates, a wall of potential is created directly under the read-out gate 14 and the movement gate 31 is separated from the valley of potential created directly under the photodiode 13 (the state of separating valley of potential) as shown in FIG. 2(c).

Meanwhile, at this point, electrons cannot go out of the valley of potential directly under the movement gate 31.

Next, when the voltage Vdg is kept applied to the distribution gates and electric potential near the substrate potential Vss is given to the movement gate 31 to return the voltage, the valley of potential directly under the movement gate 31 disappears as shown in FIG. 2(d), so that the electrons that existed in the valley move to a channel on the distribution gate side having low potential, electrons that moved to a channel directly under the distribution gate (DG) further move to the charge-storage section having lower potential without staying, and stored in the charge-storage section (the state of re-transferring electrons).

As described above, according to the pixel structure 30 equipped with three stages of gates, electrons can be completely transferred from the photodiode 13 to the charge-storage section.

Meanwhile, the present inventor prototyped a solid-state image sensor of a pixel structure which is equipped with the pixel structure 30 having the gate structure of three stages and devised so as to prevent variation in a threshold value of the rear stage gates performing distribution of electrons from affecting distribution of electrons to the charge-storage section, conducted various experiment, and confirmed its effect.

As a result, the inventor could confirm that the pixel structure 30 had the effect of suppressing variation.

On the other hand, the inventor also simultaneously confirmed that there remained problems to be solved in achieving high-speed charge sorting in the pixel structure 30. The problems are specifically Problems 1 to 3 as described below.

Hereinafter, description will be made for Problems 1 to 3 of the pixel structure 30, and to make the Problems 1 to 3 easily understood, the operation of the pixel structure 30 will be described again referring to a principled plane structure explanatory view shown in FIG. 3 which schematically illustrates polysilicon regions (regions shown by solid line in FIG. 3) and an active region (region shown by dashed line in FIG. 3) in the pixel structure 30 in a sectionalized manner (plane structure explanatory view shown in FIG. 3 is a plane structure explanatory view corresponding to FIG. 1(a)), and a principled cross-sectional structure explanatory view shown in FIG. 4 schematically illustrates the regions of N type or P type in the pixel structure 30 in detail (the cross-sectional structure explanatory view shown in FIG. 4 is a cross-sectional structure explanatory view corresponding to FIG. 1(b)).

Meanwhile, in the pixel structure shown in FIG. 3 and FIG. 4, regarding constitution equal or corresponding to the constitution shown in FIGS. 1(a) (b), detailed description of the constitution and function should be appropriately omitted by showing in the same numerical characters as the numerical characters used in FIGS. 1(a) (b).

Further, although not shown in FIG. 3 and FIG. 4, areas other than the photodiode 13 of the pixel structure 30 are blocked by metal wiring layer or the like in the same manner as shown in FIGS. 1(a) (b) and light is irradiated only to the photodiode 13 of the pixel structure 30.

Then, as described referring to FIG. 2, a positive voltage as shown in FIG. 5 should be applied in order to each gate of the read-out gate 14, the movement gate 31, the first distribution gate 15 and the second distribution gate 16, and its repetition frequency is 1 to 30 MHz.

Meanwhile, it is preferable that the photodiode 13 be formed by a pinned structure similar to the one disclosed in Japanese Patent Laid-open No. 2007-110162.

Further, boundary of each region such as boundary between the N type region and P type region shown in FIG. 4 is schematically expressed for easy understanding, and there is actually distribution of impurity concentration depending on a semiconductor process.

Herein, regarding dope concentration of impurity in each region, it is preferable to set the impurity concentration of the region of "PW" (P type impurity middle-concentration doped region) higher by about a single digit than the impurity concentration of a substrate (epilayer) composed of the region of "P−" (P type impurity low-concentration doped region), the impurity concentration of the region of "N−" (N type impurity low-concentration doped region) higher by about a single digit than the PW region, and the impurity concentration of the region of "N+" (N type impurity high-concentration doped region) higher by a single digit or more than the region of N−. It is to be noted that ionic species to be implanted should only be appropriately selected.

Further, it is preferable that the level (size) of layout or a range of thickness of each layer be as shown below (refer to FIG. 3 and FIG. 4).

More specifically, it is preferable that the size of layout in planar view be as follows.

Dimension a: 1.5 to 10.5 μm
Dimension b: 1.5 to 10.5 μm
Dimension c: 1.2 to 8.4 μm
Dimension d: 0.35 to 1.8 μm
Dimension e: 0.25 to 1.5 μm
Dimension f: 0.25 to 1.5 μm
Dimension g: 0.5 to 1.5 μm
Dimension h: 0.5 to 1.5 μm
Dimension i: 0.5 to 1.5 μm
Gap g2: 0.1 to 0.3 μm
Gap g3: 0.1 to 0.3 μm
Gap g4: 0.1 to 0.3 μm
Gap g5: 0.1 to 0.3 μm
Gap g6: 0.25 to 0.75 μm Further, the thickness of each layer depends on a process used in manufacturing, and thickness below is preferable.

More specifically, the thickness below is preferable.

Thickness j (P type substrate (epitaxial layer)): 5 to 22.5 μm
Thickness k (P well layer): 4 to 13.5 μm
Thickness l (photodiode region): 1 to 6.8 μm
Thickness m (charge-storage section): 0.1 to 0.8 μm
Thickness n (P well layer): 2 to 13.5 μm
Thickness o (SOX thickness): 2.5 to 22.5 nm (depends on a working voltage)
Thickness p (gate thickness): 0.05 to 0.5 μm Herein, when light is irradiated on the pixel structure 30, the irradiated light is ionized into electrons and holes by depletion layer that spreads in a junction area between the N type impurity low-concentration doped region of the photodiode 13 and the substrate 11 being the P type impurity low-concentration doped region.

Then, the ionized holes are absorbed by the substrate 11, and the electrons are stored in the N type impurity low-concentration doped region of the photodiode 13 (refer to FIG. 2(a)).

Then, when a positive voltage is applied to the read-out gate 14 being the first-stage gate after certain time passed, the electrons stored in the N type impurity low-concentration doped region of the photodiode 13 move to the channel formed directly under the read-out gate 14.

Next, when a positive voltage is applied to the movement gate 31 being the second-stage gate, the electrons can be moved to the channel formed directly under the movement gate 31 (refer to FIG. 2(b)).

Then, when the applied voltage of the read-out gate 14 is returned to zero after short time passed, the electrons that exist in the channel directly under the read-out gate 14 are pushed out to the channel directly under the movement gate 31 to which a voltage is applied or the photodiode 13.

Herein, in the case where the potential of the movement gate 31 is lower than potential at which electrons return to the photodiode 13, all electrons move directly under the movement gate 31 (refer to FIG. 2(c)).

Next, when a positive voltage is applied to either one of the first distribution gate 15 and the second distribution gate 16 as a pair of distribution gates being the third-stage gates, electrons move to the channel directly under the first distribution gate 15 or the second distribution gate 16 to which a voltage was applied.

Herein, when the applied voltage of the movement gate 31 is returned to zero, the channel directly under the gate disappears, and electrons completely move to the channel created directly under the first distribution gate 15 or the second distribution gate 16 to which a voltage was applied (refer to FIG. 2(d)).

Next, when the applied voltage of the first distribution gate 15 or the second distribution gate 16 to which a positive voltage was applied is returned to zero, electrons that exist in the channel directly under the gate completely move to the first charge-storage section 17 or the second charge-storage section 18, which is formed of the N type impurity high-concentration doped region, and all electrons are collected.

Herein, by alternately applying a voltage to the first distribution gate 15 and the second distribution gate, electrons generated by light, which was irradiated synchronously with the series of gate-applied voltages, can be sorted to the first charge-storage section 17 and the second charge-storage section 18 being two charge-storage sections.

FIG. 6 schematically illustrates the series of electron movement. Description will be made while referring to FIG. 6, in which electrons move through the photodiode 13 (refer to arrow A), pass through the read-out gate 14 being the first-stage gate based on a voltage applied to each gate (refer to arrow B), and pass through the movement gate 31 being the second-stage gate (refer to arrow C).

It is to be noted that arrow C is drawn slightly above the center of the movement gate 31 in FIG. 6, but areas where electrons actually pass are expected to be distributed stochastically, and a case of such distribution is drawn here.

Then, since a voltage is applied to either one of the first distribution gate 15 and the second distribution gate 16 which are the third-stage gates, electrons pass through either one distribution gate in a route of arrow D or arrow E in response to the application of voltage to the first distribution gate 15 and the second distribution gate 16.

It is to be noted that the gaps (g2, g3) between each gate should be the closest distance that is permitted in a manufacturing process as described above.

Although potential by the gate-applied voltage does not seem to be applied to these gaps (g2, g3), a slight voltage is actually applied due to the lateral effect of gate to form a shallow channel, and electrons can be moved.

However, as the present inventor prototyped the solid-state image sensor equipped with the pixel structure 30 and conducted various experiment as described above, the inventor discovered Problems 1 to 3 described below.

(1) Problem 1

As it is self-evident when seeing the schematic view of electrons movement shown in FIG. 6, the electron-moving distance in the photodiode 13 (refer to arrow A) is longer than the moving distance of electrons when passing through each gate (refer to arrow B to E).

However, force that attracts electrons in the photodiode 13 is generated by a voltage applied to the read-out gate 14 being the first-stage gate that is positioned at one end portion being one end of the photodiode 13.

Therefore, attraction that electrons, which were generated near an end portion on the opposite side of a side of the photodiode 13 where the read-out gate 14 is positioned, receive is weaker than attraction that electrons, which were generated near the side of the photodiode 13 where the read-out gate 14 is positioned.

Herein, according to the consideration of the present inventor, if the photodiode 13 is an ideal photodiode as shown in FIG. 7(a), electrons are expected to be accelerated to reach the channel directly under the read-out gate 14 in sufficiently short time (a few tens of nanoseconds, for example) according to gradual potential gradient that is generated by a voltage applied to the read-out gate 14 being the first-stage gate.

However, the present inventor considered that unevenness actually occurred in potential generated by a voltage, which was applied to the read-out gate 14 being the first-stage gate, due to non-uniform manufacture of the photodiode 13 and electrons were trapped in the photodiode 13 to become residual as shown in FIG. 7(b)

Then, since it is impossible to predict at which point the electrons residual in the photodiode 13 in this manner move, there is a possibility that read-out by strict time of a nanosecond unit cannot be performed.

In a general image sensor having sufficiently long (a few milliseconds, for example) exposure time comparing to electron moving time, this residual time is negligibly short and the number of residual electrons is negligibly few.

However, when the case where the solid-state image sensor is used as an optical time-of-flight distance sensor is considered, the fact that exposure time in detecting optical time-of-flight is as short as 50 to 100 nanoseconds and the number of electrons generated by incoming light in the time is as very few as a few is taken in account, residual time of electrons and the number of residual electrons caused by the concave of potential in the photodiode 13 become non-negligible.

More specifically, the fear that residual electrons exist in the photodiode 13 is Problem 1 to be solved.

(2) Problem 2

Electrons that were moved from the channel directly under the read-out gate 14 being the first-stage gate and exist in the channel directly under the movement gate 31 being the second-stage gate move directly under either one gate of the first distribution gate 15 and the second distribution gate 16 which are the third-stage gates to which voltage is applied next.

At this point, electrons near the center of the movement gate 31 being the second-stage gate are attracted to the third-stage gate to which a voltage was applied (the first distribution gate 15 or the second distribution gate 16) and correct distributed.

However, an electron at the end portion of the movement gate 31 being the second-stage gate in the vertical directions on FIG. 6, that is, the electron shown by numerical character F which is at the end portion on the upper side of the movement gate 31 in FIG. 6, for example, has different routes to be moved in the case of moving to the first distribution gate 15 being the third-stage gate closer to electron F as shown in arrow D and the case of moving to the second distribution gate 16 being the third-stage gate farther from electron F as shown in arrow E.

Herein, when electron F moves to the first distribution gate 15 that is the closer third-stage gate as shown in arrow D, electron F receives strong attraction by potential caused by a voltage applied to the first distribution gate 15 that is the third-stage gate, so that electron F securely moves to the first distribution gate 15.

On the other hand, in the case where electron F needs to move to the second distribution gate 16 that is the farther third-stage gate as shown in arrow E, attraction that electron F receives becomes weaker due to a long distance.

Thus, even if attraction that electron F receives is weak, moving according to weak attraction generated by a small potential difference is made possible if the channel directly under the movement gate 31 being the second-stage gate has an ideally uniform structure.

However, unevenness of potential actually exists in the channel formed directly under the movement gate 31 being the second-stage gate due to manufactural non-uniformity as described in Problem 1, electrons cannot come out from the potential concave that exist in a course, and a case where electrons have difficulty of moving to the farther distribution gate is considered.

Then, in such a case, electrons become residual for short time directly under the movement gate 31 being the second-stage gate or a gap between the movement gate 31 being the second-stage gate and the first distribution gate 15 or the second distribution gate 16 which is the third-stage gate.

As described, when a distribution gate to which a voltage is applied is changed in the distribution gate being the third-stage gate (the first distribution gate 15 or the second distribution gate 16) and a voltage is applied to the distribution gate (the first distribution gate 15 or the second distribution gate 16) being the third-stage gate closer to the residual electrons while electrons are residual directly under the movement gate 31 being the second-stage gate or the gap between the movement gate 31 being the second-stage gate and the first distribution gate 15 or the second distribution gate 16 which is the third-stage gate, strong potential gradient makes the residual electrons move to a channel directly under the closer distribution gate.

More specifically, a destination of electrons is decided depending on where in the channel directly under the movement gate 31 being the second-stage gate electrons exist, and even when a voltage is alternately applied to the first distribution gate 15 and the second distribution gate 16 which are the third-stage gates aiming at distribution by time, there is a fear of a phenomenon that electrons do not pass through a distribution gate farther than a position where electrons exist in the channel directly under the movement gate 31 being the second-stage gate occurs.

More specifically, a fear that electron transfer from the movement gate 31 being the second-stage gate to the distribution gates being the third-stage gates (the first distribution gate 15 and the second distribution gate 16) becomes uncertain is Problem 2 to be solved.

(3) Problem 3

The pixel structure 30 of the solid-state image sensor shown in FIG. 3 and FIG. 4 is manufactured by a multistage integrated circuit process in which a plurality of masks are used.

In the manufacturing process by such an integrated circuit process, it is impossible to eliminate an error of a mask itself and a positioning error.

In short, even when pixel structure 30 of the solid-state image sensor is manufactured aiming at a uniform structure, occurrence of slight variation or imbalance must be accepted.

Herein, when imbalance of a threshold value occurs in the first distribution gate 15 and the second distribution gate 16 which are the third-stage gates, a difference occurs between the electron transfer efficiency of one distribution gate and the electron transfer efficiency of the other distribution gate.

Further, if a small capacitance difference is between the first charge-storage section 17 and the second charge-storage section 18 being two charge-storage sections, a difference of charge-voltage conversion efficiency occurs between the both.

Although such a problem is also a general problem in an integrated circuit, it could become a capital problem due to the fact that the number of electrons dealt with is extremely small when the case of using the solid-state image sensor as an optical time-of-flight distance sensor is taken in consideration.

More specifically, occurrence of imbalance in electron transfer efficiency by manufacturing accuracy (error) is Problem 3 to be solved.

[Patent Document 1]
Japanese Patent Laid-open No. 2005-235893

OBJECTS AND SUMMARY OF THE INVENTION

The present invention has been created in view of the Problems 1 to 3, and it is an object of the invention to provide a pixel structure of a solid-state image sensor of a charge sorting method which distributes electrons used in an optical time-of-flight measurement method or the like to perform charge storage, in which the pixel structure is capable of solving the Problems 1 to 3 in order to improve charge sort efficiency in a high-speed operation.

More specifically, in view of Problem 1, it is an object of the present invention to provide a pixel structure of a solid-state image sensor in which residual electrons in a photodiode can be reduced.

Further, in view of Problem 2, it is an object of the present invention to provide a pixel structure of a solid-state image sensor in which transfer of electrons from a movement gate being the second-stage gate to the distribution gates being the third-stage gates can be securely performed.

Moreover, in view of Problem 3, it is an object of the present invention to provide a pixel structure of a solid-state image sensor in which imbalance of electron transfer efficiency or the like caused by manufacturing accuracy (error) can be reduced.

To achieve the above-described objects, the present invention is that structural characteristics are further added in the pixel structure of the solid-state image sensor, which was proposed as the second embodiment of the invention in the Patent Application No. 2007-181696, to improve charge sort efficiency in a high-speed operation.

The structural characteristics to be added are characterized by having high sensitivity and capability of performing high-speed and accurate electron distribution even on the assumption of non-uniform dope concentration of impurity contained in semiconductor manufacture process, non-uniform silicon oxide film thickness, fine imbalance of mask, and stochastic variation, and the present invention proposes these structural characteristics as a design method of optimizing the plane layout of an integrated circuit.

More particularly, the present invention is that gradient on which electrons naturally move in a read-out gate direction being the first-stage gate is formed on potential of a photodiode.

Therefore, according to the present invention, the gradient allows electrons generated in the photodiode to naturally move in the read-out gate direction being the first-stage gate, the number of residual electrons in the photodiode can be significantly reduced, and Problem 1 can be solved.

Further, to achieve the above-described objects, the present invention is that transferred electrons are moved intensively near the boundary between a pair of the distribution gates being the third-stage gates to arrange conditions on which the distribution gates efficiently perform distribution operation of electrons.

Therefore, according to the present invention, possibility that imbalanced distribution occurs in the distribution gates being the third-stage gates can be eliminated, electron transfer from the movement gate being the second-stage gate to the distribution gates being the third-stage gates can be securely performed, and Problem 2 can be solved.

Further, to achieve the above-described objects, the present invention secures possibility that electrons can be moved from one of a pair of the distribution gates being the third-stage gates to the other one, and eliminates possibility that a voltage is not applied and electrons are trapped to a closed distribution gate side.

Therefore, according to the present invention, possibility that a voltage is not applied and electrons are trapped to a closed distribution gate side can be eliminated, electron transfer from the movement gate being the second-stage gate to the distribution gate being the third-stage gate can be securely performed, and Problem 2 can be solved.

Further, to achieve the above-described objects, the present invention is that each element that constitutes the pixel structure of a solid-state image sensor is symmetrically arranged.

Therefore, according to the present invention, variation in mask accuracy, exposure positional accuracy or the like that covers manufacturing accuracy can be lightened, imbalance of electron transfer efficiency or the like caused by manufacturing accuracy (error) can be reduced, and Problem 3 can be solved.

Then, the present invention is the pixel structure of a solid-state image sensor that distributes electrons generated by photoelectric conversion to perform charge storage, in which the structure has a photodiode that generates electrons by photoelectric conversion, a plurality of charge-storage sections that store electrons generated in the photodiode, and a gate structure that is arranged between the photodiode and the charge-storage sections and controls transfer of electrons generated in the photodiode to the plurality of the charge-storage sections, the gate structure is made up of three stages of gates, the three stages of gates has a first-stage gate that is arranged adjacent to the photodiode and controls read-out of electrons generated in the photodiode, a second-stage gate that is adjacent to the first-stage gate on the rear stage of the gate at a predetermined gap and controls movement of electrons read out by the readout control of the first-stage gate to the plurality of the charge-storage sections, and a plurality of third-stage gates that are adjacent to the second-stage gate on the rear stage of the gate at a predetermined gap, severally arranged corresponding to the plurality of the charge-storage sections, and perform control of distributing the electrons moved by the movement control of the second-stage gate severally to the plurality of the charge-storage sections, and gradient on which electrons are moved in the first-stage gate direction is formed on the potential of the photodiode.

Further, the present invention is the pixel structure of a solid-state image sensor, in which the photodiode is formed so as to narrow a potential well in which electrons could exist proportional to distance from the first-stage gate.

Further, the present invention is the pixel structure of a solid-state image sensor, in which substrate impurity dope concentration directly under the end portion of the photodiode on the opposite side of the first-stage gate side and a peripheral area of the photodiode is increased, and the potential well of the photodiode is allowed to unevenly exist at the central portion of the photodiode and in the vicinity of the first-stage gate.

Further, the present invention is the pixel structure of a solid-state image sensor, in which the structure has a photodiode that generates electrons by photoelectric conversion, a plurality of charge-storage sections that store electrons generated in the photodiode, and a gate structure that is arranged between the photodiode and the charge-storage sections and controls transfer of electrons generated in the photodiode to the plurality of the charge-storage sections, the gate structure is made up of three stages of gates, the three stages of gates has a first-stage gate that is arranged adjacent to the photodiode and controls read-out of electrons generated in the photodiode, a second-stage gate that is adjacent to the first-stage gate on the rear stage of the gate at a predetermined gap and controls movement of electrons read out by the readout control of the first-stage gate to the plurality of the charge-storage sections, and a plurality of third-stage gates that are adjacent to the second-stage gate on the rear stage of the gate at a predetermined gap, severally arranged corresponding to the plurality of the charge-storage sections, and perform control of distributing the electrons moved by the movement control of the second-stage gate severally to the plurality of the charge-storage sections, and the second-stage gate moves so as to allows electrons intensively move to an area near the boundaries of the plurality of the third-stage gates.

Further, the present invention is the pixel structure of a solid-state image sensor, in which substrate impurity dope concentration directly under the end portion of the second-stage gate is increased to allow electrons to intensively move directly under the central portion of the second-stage gate, and electrons are allowed to intensively move to an area near the boundaries of the plurality of the third-stage gates.

Further, the present invention, is the pixel structure of a solid-state image sensor that distributes electrons generated by photoelectric conversion to perform charge storage, in which the structure has a photodiode that generates electrons by photoelectric conversion, a plurality of charge-storage sections that store electrons generated in the photodiode, and a gate structure that is arranged between the photodiode and the charge-storage sections and controls transfer of electrons generated in the photodiode to the plurality of the charge-storage sections, the gate structure is made up of three stages of gates, the three stages of gates has a first-stage gate that is arranged adjacent to the photodiode and controls read-out of electrons generated in the photodiode, a second-stage gate that is adjacent to the first-stage gate on the rear stage of the gate at a predetermined gap and controls movement of electrons read out by the readout control of the first-stage gate to the plurality of the charge-storage sections, and a plurality of third-stage gates that are adjacent to the second-stage gate on the rear stage of the gate at a predetermined gap, severally arranged corresponding to the plurality of the charge-storage sections, and perform control of distributing the electrons moved by the movement control of the second-stage gate severally to the plurality of the charge-storage sections, and a channel through which electrons can be moved is formed near the boundary between each gate in the plurality of the third-stage gates.

Further, the present invention is the pixel structure of a solid-state image sensor, in which the channel is formed by providing a region having low substrate impurity dope concentration directly under the boundary between each gate in the plurality of the third-stage gates.

Further, the present invention is the pixel structure of a solid-state image sensor that distributes electrons generated by photoelectric conversion to perform charge storage, in which the structure has a photodiode that generates electrons by photoelectric conversion, a plurality of charge-storage sections that store electrons generated in the photodiode, and a gate structure that is arranged between the photodiode and the charge-storage sections and controls transfer of electrons generated in the photodiode to the plurality of the charge-storage sections, the gate structure is made up of three stages of gates, the three stages of gates uses the pixel structure of a solid-state image sensor, which has a first-stage gate that is arranged adjacent to the photodiode and controls read-out of electrons generated in the photodiode, a second-stage gate that is adjacent to the first-stage gate on the rear stage of the gate at a predetermined gap and controls movement of electrons read out by the readout control of the first-stage gate to the plurality of the charge-storage sections, and a plurality of third-stage gates that are adjacent to the second-stage gate on the rear stage of the gate at a predetermined gap, severally arranged corresponding to the plurality of the charge-storage sections, and perform control of distributing the electrons moved by the movement control of the second-stage gate severally to the plurality of the charge-storage sections, as a basic constituent unit, in which a plurality of the basic constituent units are used, the plurality of basic constituent units are symmetrically arranged, and the plurality of basic constituent units are connected in series.

Since the present invention is constituted as described above, an excellent effect is exerted that the pixel structure of a solid-state image sensor capable of solving the Problems 1 to 3 can be provided in the pixel structure of a solid-state image sensor of charge sorting method which distributes electrons used in an optical time-of-flight measurement method or the like to perform charge storage.

More specifically, since the present invention is constituted as described above, an excellent effect is exerted that the pixel structure of a solid-state image sensor in which residual electrons in a photodiode are reduced can be provided.

Further, since the present invention is constituted as described above, an excellent effect is exerted that the pixel structure of a solid-state image sensor in which electron transfer from the movement gate being the second-stage gate to the distribution gates being the third-stage gates can be securely performed can be provided.

Moreover, since the present invention is constituted as described above, an excellent effect is exerted that the pixel structure of a solid-state image sensor in which imbalance of electron transfer efficiency or the like caused by manufacturing accuracy (error) is reduced can be provided.

The present invention mentioned above can be used in a solid-state image sensor used for three-dimensional image acquisition by optical time-of-flight measurement, a solid-state image sensor used for selective image photography by modulation light source illumination, a solid-state image sensor used for demodulation of multi-channel light communication, a solid-state image sensor used for high-speed photography, particularly for high-speed photography that requires time accuracy of microsecond or less, and the like.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 1(a) is a plane structure explanatory view schematically illustrating the principled plane structure of the pixel structure of a solid-state image sensor according to the second embodiment of the invention, which was proposed by Patent Application No. 2007-181696, and FIG. 1(b) is a cross-sectional structure explanatory view schematically illustrating the principled cross-sectional structure of FIG. 1(a) taken along B-B line.

FIG. 8 is a plane structure explanatory view corresponding to FIG. 3, which schematically illustrates a principled plane structure of the pixel structure of a solid-state image sensor according to the first embodiment of the present invention.

FIG. 10(a) is a solid structure explanatory view schematically illustrating a principled solid structure of PW layer composed of a P type impurity middle-concentration doped region, which constitutes the photodiode in the pixel structure of a solid-state image sensor according to the first embodiment of the present invention, FIG. 10(b) is a solid structure explanatory view schematically illustrating a principled solid structure of N-layer composed of an N type impurity middle-concentration doped region, which constitutes the photodiode in the pixel structure of the solid-state image sensor according to the first embodiment of the present invention, and FIG. 10(c) is a solid structure explanatory view schematically illustrating a principled solid structure of the photodiode in the pixel structure of a solid-state image sensor by the first embodiment which is constituted by stacking the PW layer composed of a P-region, which is shown in FIG. 10(a), on a substrate and by stacking the N-layer shown in FIG. 10(b) on the PW layer.

FIG. 15 is a plane structure explanatory view schematically illustrating a principled plane structure of the pixel structure of a solid-state image sensor according to the fourth embodiment of the present invention.

DETAILED DESCRIPTION OF THE PREFERRED EMBODIMENTS

Hereinafter, referring to the attached drawings, description will be made in detail for examples of the embodiments of the pixel structure of a solid-state image sensor according to the present invention.

Meanwhile, regarding constitution equal or corresponding to the constitution already described, detailed description of the constitution and function should be appropriately omitted by showing in the same numerical characters.

1. First Embodiment

Embodiment to Solve Problem 1: Method of Reducing Residual Electrons in a Photodiode The first embodiment is to form gradient on which electrons naturally move in a read-out gate direction being the first-stage gate on the potential of the photodiode.

Figure 7A:
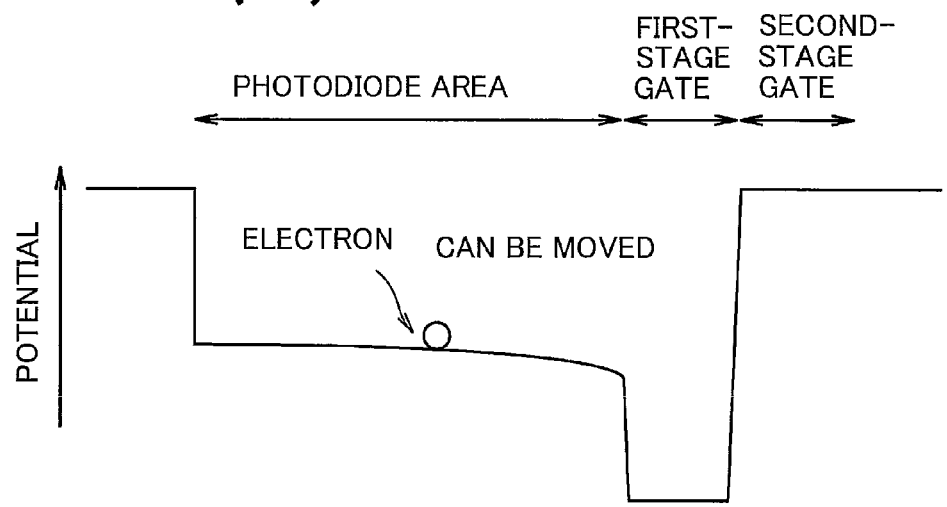
FIGS. 7(a) (b) are explanatory views of mechanism in which residual electrons are generated in a photodiode.
Figure 7B:
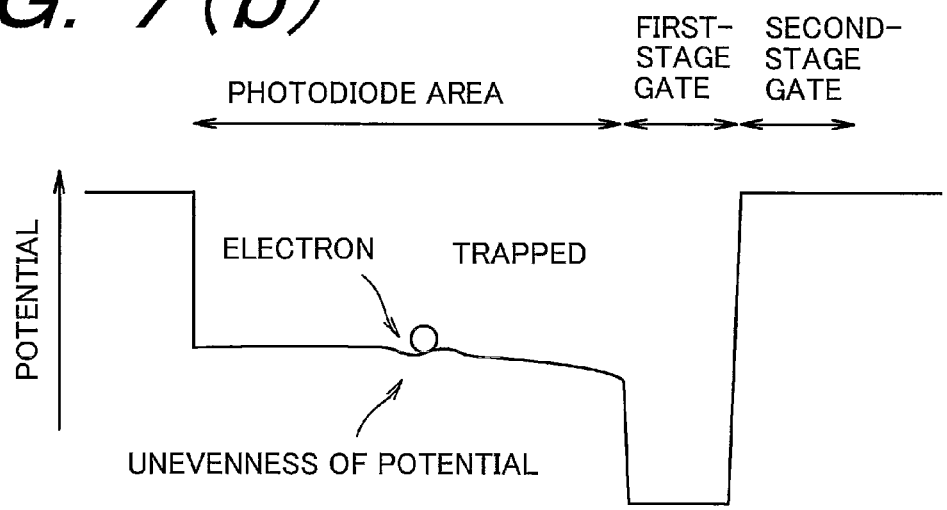

More specifically, based on the mechanism of generating residual electrons shown in FIG. 7(b), the present inventor considered that forming gradient on which electrons naturally move in the read-out gate direction to the potential of the photodiode significantly reduced the number of residual electrons in the photodiode.

Herein, as a method of forming gradient on the potential of the photodiode, there are known a method of making the shape of the photodiode itself be a trapezoidal shape which is disclosed in Publication of Japanese Patent Laid-open No. Hei7-240505, a method of making the shape of the photodiode itself be a triangular shape which is disclosed in Publication of Japanese Patent Laid-open No. 2007-81083, and a method of allowing the impurity concentration of the photodiode to have gradient which is disclosed in Publication of Japanese Patent Laid-open No. 2002-231926, for example.

However, according to the method of making the shape of the photodiode itself be a trapezoidal shape or a triangular shape, there was a problem that loss of an opening area for the photodiode became larger in a general lattice-shaped array.

Further, according to the method of allowing the impurity concentration of the photodiode to have gradient, there was a problems that a special process was required for manufacturing it, and gradient of obtained potential was relatively small.

Figure 2A:
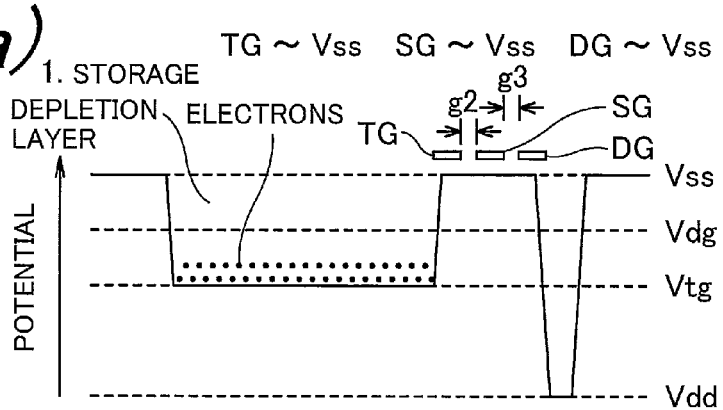
FIGS. 2(a) (b) (c) (d) are explanatory views schematically illustrating potential in semiconductor when a voltage is applied to a read-out gate, a movement gate, a first distribution gate and a second distribution gate corresponding to each element in the cross-sectional explanatory view shown in FIG. 1(b).
Figure 2B:
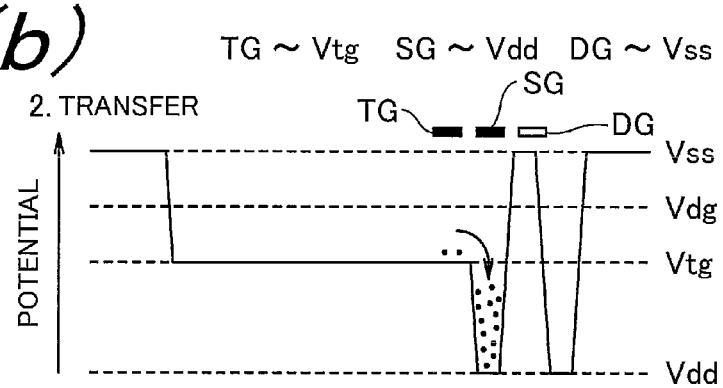
Figure 2C:
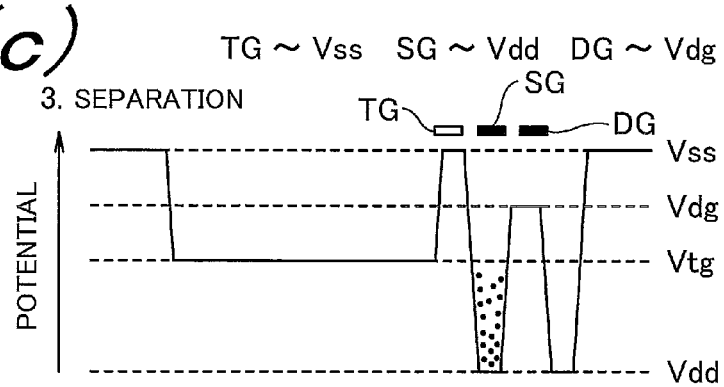
Figure 2D:
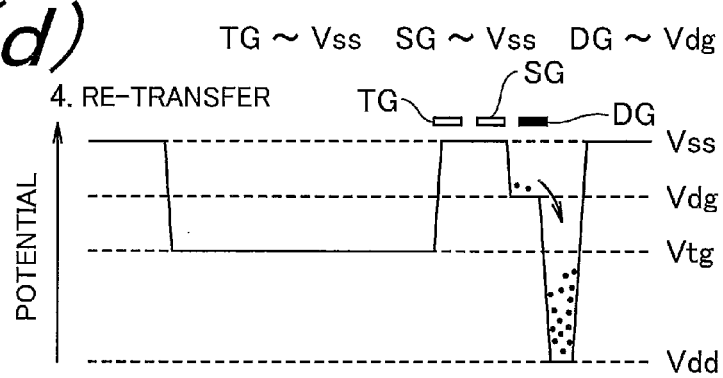
Figure 3:
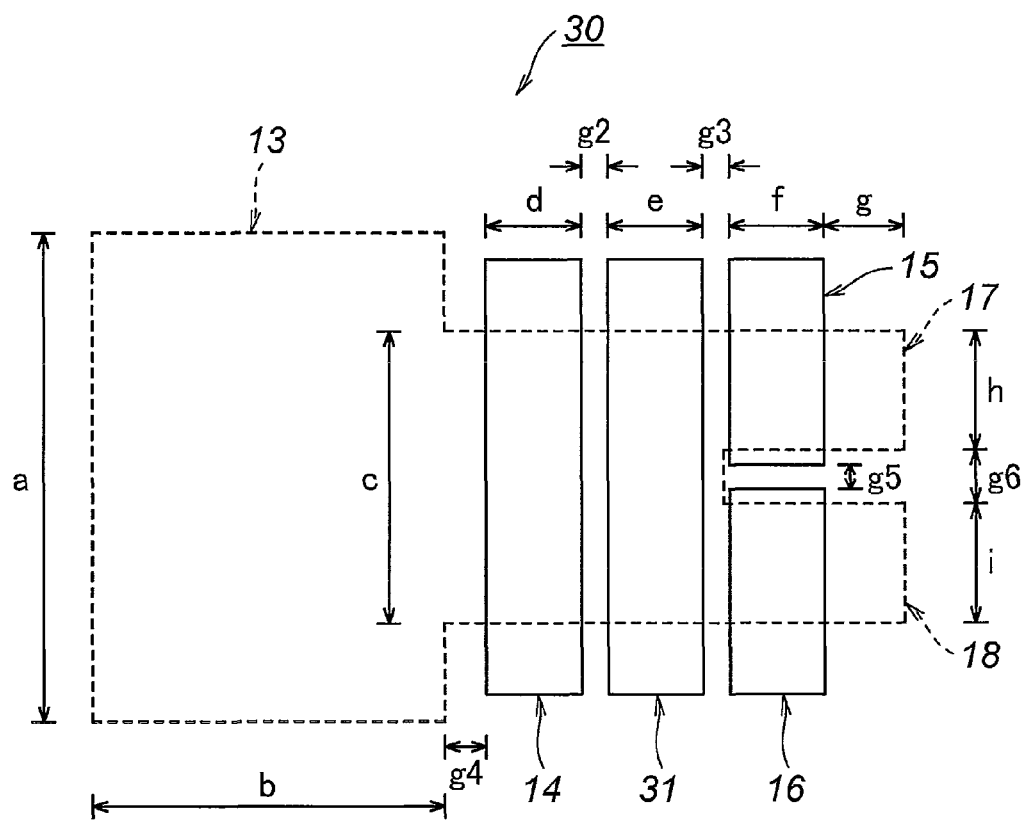
FIG. 3 is a principled plane structure explanatory view schematically illustrating polysilicon regions (regions shown by solid line in FIG. 3) and an active region (region shown by dashed line in FIG. 3) in the pixel structure shown in FIG. 1 in a sectionalized manner, which is a plane structure explanatory view corresponding to FIG. 1(a).
Figure 4:
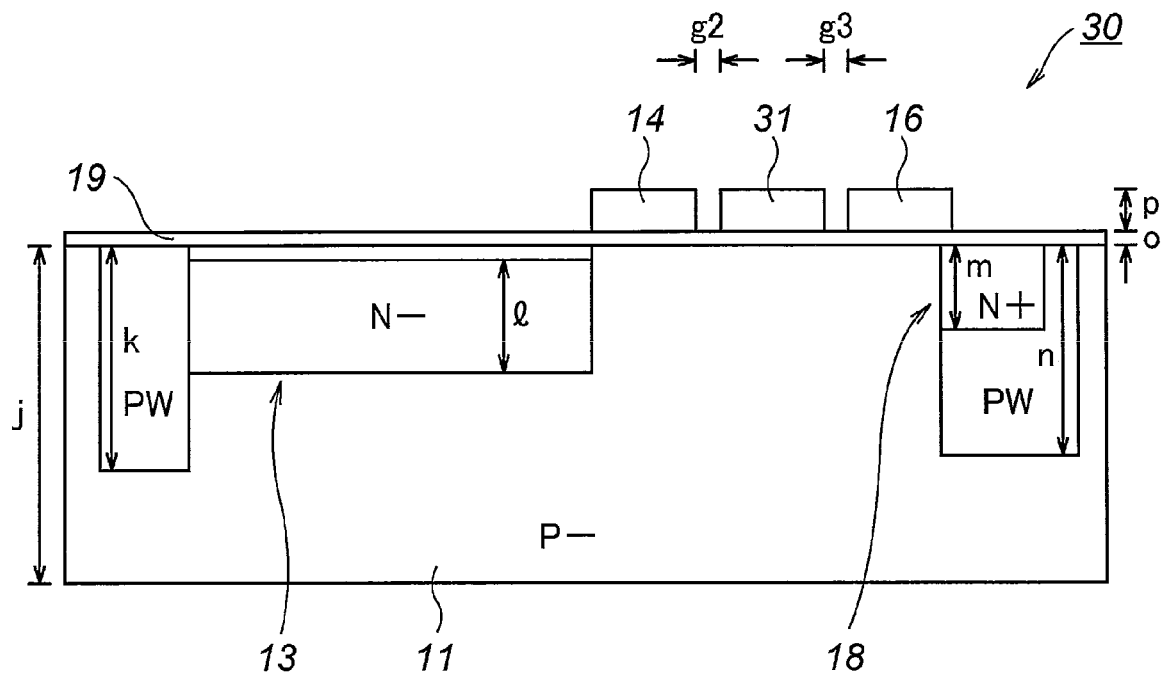
FIG. 4 is a principled cross-sectional structure explanatory view schematically illustrating the regions of N type or P type in the pixel structure shown in FIG. 1 in more detail, which is a cross-sectional structure explanatory view corresponding to FIG. 1(b).
Figure 5:
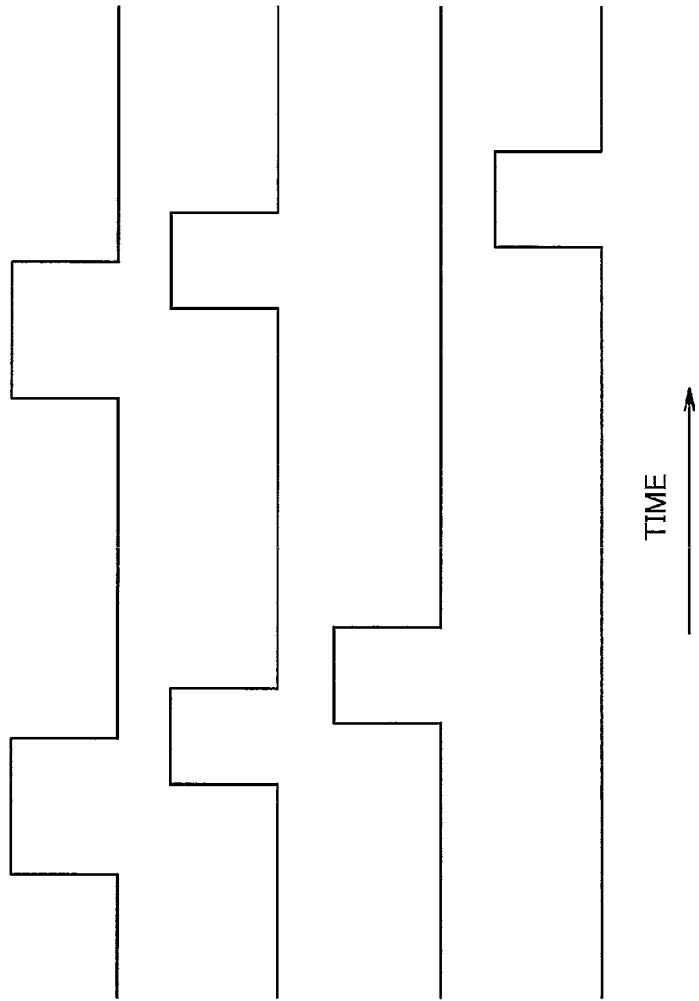
FIG. 5 is a timing chart showing a voltage applied to each gate.
Figure 6:
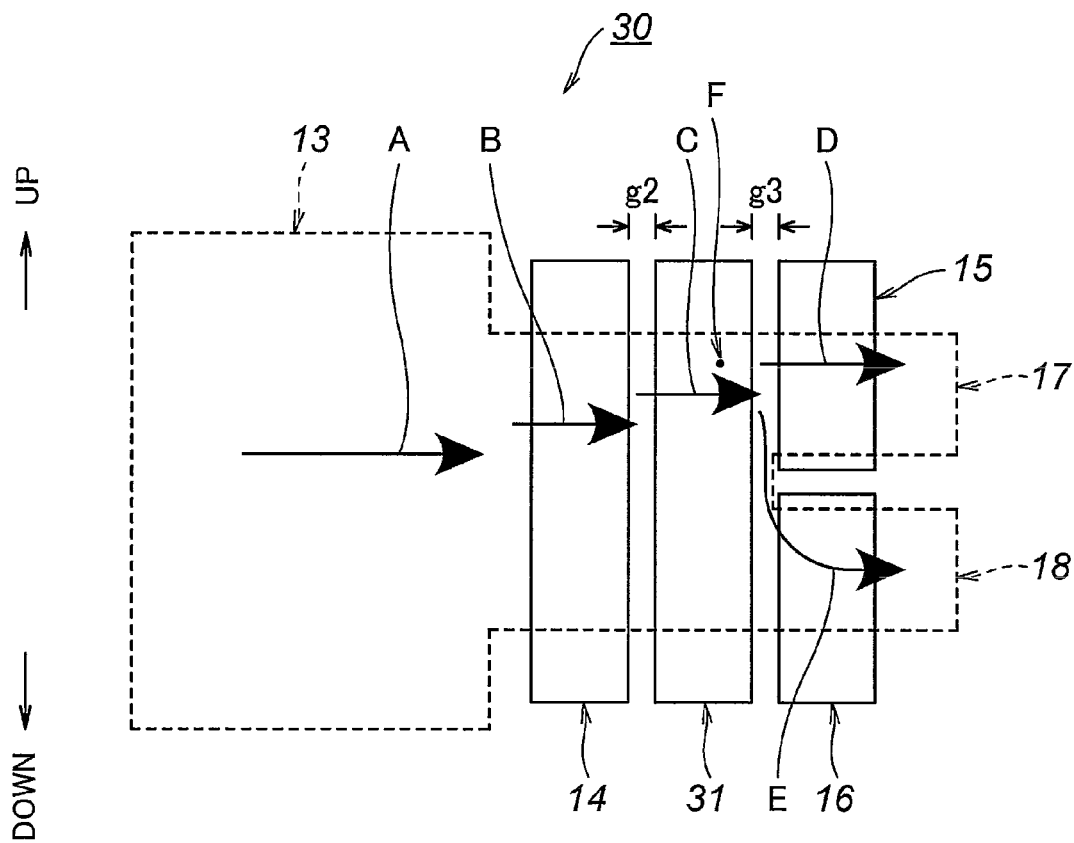
FIG. 6 is a schematic view illustrating the movement of electrons.

In the first embodiment, in the pixel structure 30 of the solid-state image sensor that the present inventor proposed which is shown in FIGS. 1(a) (b), FIG. 3 and FIG. 4, gradient was formed to the potential of the photodiode 13 by an entirely different method from the conventional method.

Figure 9:
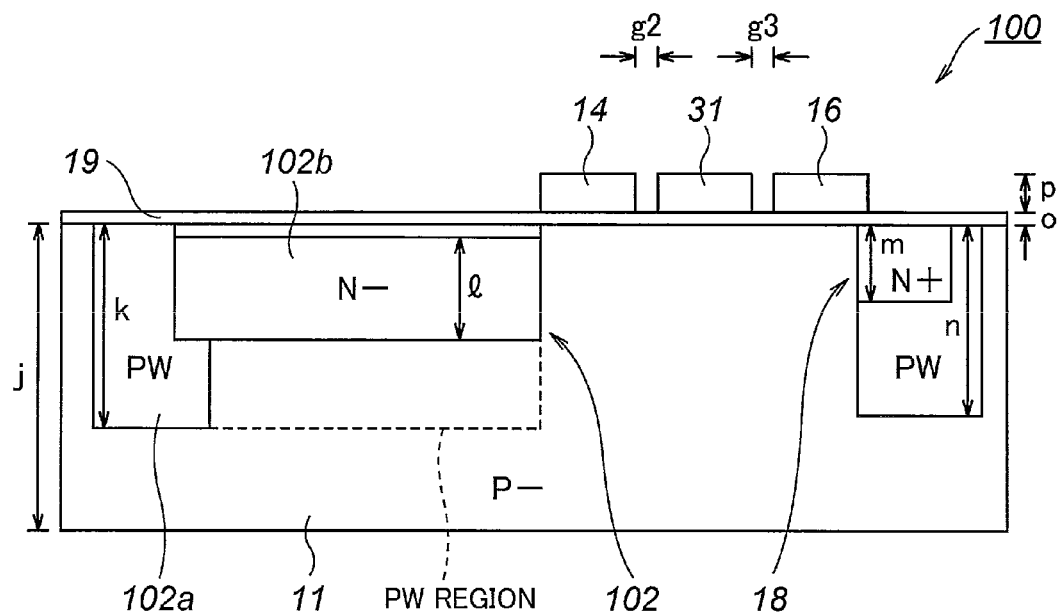
FIG. 9 is a cross-sectional structure explanatory view corresponding to FIG. 4, which schematically illustrates a principled cross-sectional structure of the pixel structure of a solid-state image sensor according to the first embodiment of the present invention.

Hereinafter, referring to the attached drawings, description will be made in detail for the pixel structure of a solid-state image sensor according to the first embodiment, in which FIG. 8 shows the plane structure explanatory view corresponding to FIG. 3, which schematically illustrates a principled plane structure of the pixel structure of a solid-state image sensor according to the first embodiment of the present invention, and FIG. 9 shows the cross-sectional structure explanatory view corresponding to FIG. 4, which schematically illustrates a principled cross-sectional structure of the pixel structure of a solid-state image sensor according to the first embodiment of the present invention, and FIG. 10(a) shows the solid structure explanatory view schematically illustrating a principled solid structure of PW layer composed of a P type impurity middle-concentration doped region, which constitutes the photodiode in the pixel structure of a solid-state image sensor according to the first embodiment of the present invention, FIG. 10(b) is the solid structure explanatory view schematically illustrating a principled solid structure of N-layer composed of an N type impurity middle-concentration doped region, which constitutes the photodiode in the pixel structure of the solid-state image sensor according to the first embodiment of the present invention, and FIG. 10(c) shows the solid structure explanatory view schematically illustrating a principled solid structure of the photodiode in the pixel structure of a solid-state image sensor by the first embodiment which is constituted by stacking the PW layer composed of a P−region, which is shown in FIG. 10(a), on a substrate and by stacking the N-layer shown in FIG. 10(b) on the PW layer.

The pixel structure 100 of a solid-state image sensor according to the first embodiment is different from the pixel structure 30 of the solid-state image sensor on the point that the structure of a photodiode 102 corresponding to a photodiode 13 in the pixel structure 30 is different from the photodiode 13.

Herein, in the photodiode 13 of the pixel structure 30, regarding an N type impurity low-concentration doped region that constitutes the photodiode 13 and the P type impurity low-concentration doped region of the substrate 11, which creates PN junction with the N type impurity low-concentration doped region, the entire surface of the N type impurity low-concentration doped region that constitutes the photodiode 13 is formed so as to join the P type impurity low-concentration doped region of the substrate 11, and their peripheral area is isolated from an adjacent pixel by the P type impurity middle-concentration doped region having slightly higher impurity concentration (refer to FIG. 4).

On the other hand, the photodiode 102 in the pixel structure 100 is constituted by forming PW layer 102a (refer to FIG. 10(a)) equipped with a trapezoidal space, which is constituted of the P type impurity middle-concentration doped region and whose bottom is positioned on the read-out gate 14 side in planar view, on the substrate 11 composed of the P type impurity low-concentration doped region, and by stacking N-layer 102b (refer to FIG. 10(b)), which is constituted of the N type impurity low-concentration doped region and has a square shape in planar view, on the upper surface of the PW layer 102a (refer to FIG. 10(c)).

More specifically, the photodiode 102 has a different layout of the P type impurity middle-concentration doped region of the substrate 11 comparing to the photodiode 13.

More particularly, although the N-layer 102b of the N type impurity low-concentration doped region, which constitutes the photodiode 102, is square in planar view, the shape of the P type impurity low-concentration doped region of the substrate 11 directly under the N-layer 102b, which creates PN junction with the N-layer 102b of the N type impurity low-concentration doped region, becomes a trapezoidal shape whose bottom is positioned on the read-out gate 14 side.

The gray region in FIG. 8 shows the P type impurity middle-concentration doped region (PW region), which shows the position of the PW layer 102a that is positioned directly under the N-layer 102b in planar view.

Meanwhile, it is preferable that the size of layout in planar view be as follows.

Dimension q: 0.5 to 3 μm

Further, as described above, in the P type impurity middle-concentration doped region that constitutes the PW layer 102a, the P type impurity concentration is formed higher by about a single digit than that of the P type impurity low-concentration doped region that constitutes the substrate 11.

Therefore, in the photodiode 102, depletion layer is shallow in the PW layer 102a and depletion layer is formed deep and wide in regions other than the PW layer 102a due to the P type impurity low-concentration doped region.

It is to be noted that electrons hole pairs that photons, which reached the PW layer 102a, generated are recombined at certain probability, boundary between the PW layer 102a and the P type impurity low-concentration doped region is actually not as clear as shown because they undergo annealing process of semiconductor, all pairs are not recombined because slight gradient is in the P type impurity concentration, and electrons are attracted in the direction of lower P type impurity concentration and reach the depletion layer.

These moved electrons and electrons generated in the depletion layer of PN junction inside the boundary of the PW layer 102a come apart from the P type region to move to the N type region, and electrons move so as to avoid directly above an area of the PW layer 102a on the substrate 11 which has high P type impurity concentration.

As a result, electrons move from the peripheral area to the center of the photodiode 102, and then to an area near the read-out gate 14.

Figure 11A:
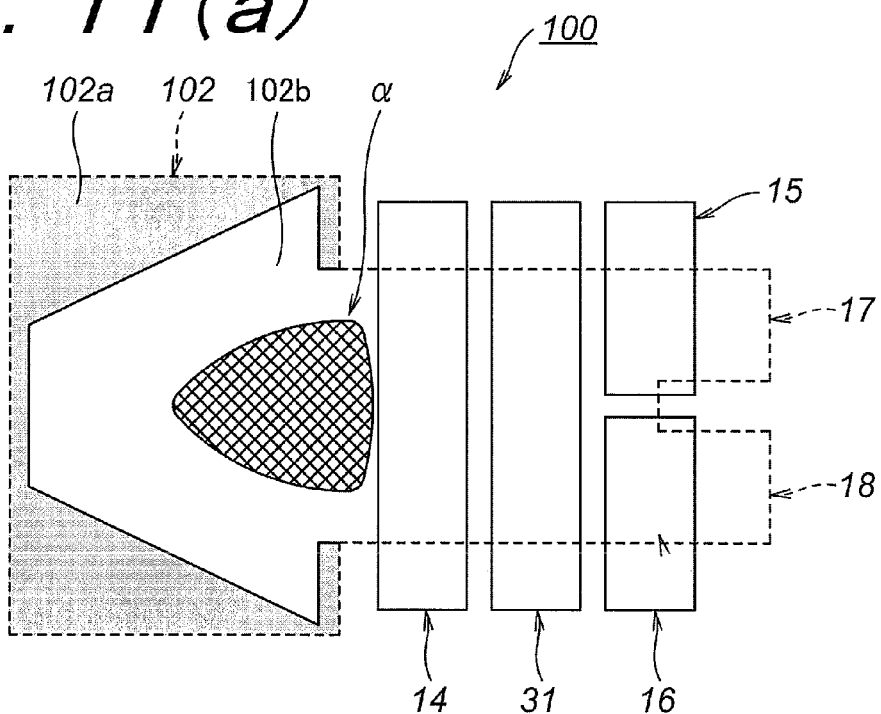
FIGS. 11(a) (b) are schematic views illustrating the movement state of electrons.

Therefore, although the N-layer 102b of the photodiode 102 has a square shape in planar view, electrons intensively move to a shaded region shown by a numerical character a in FIG. 11(a).

Figure 11B:
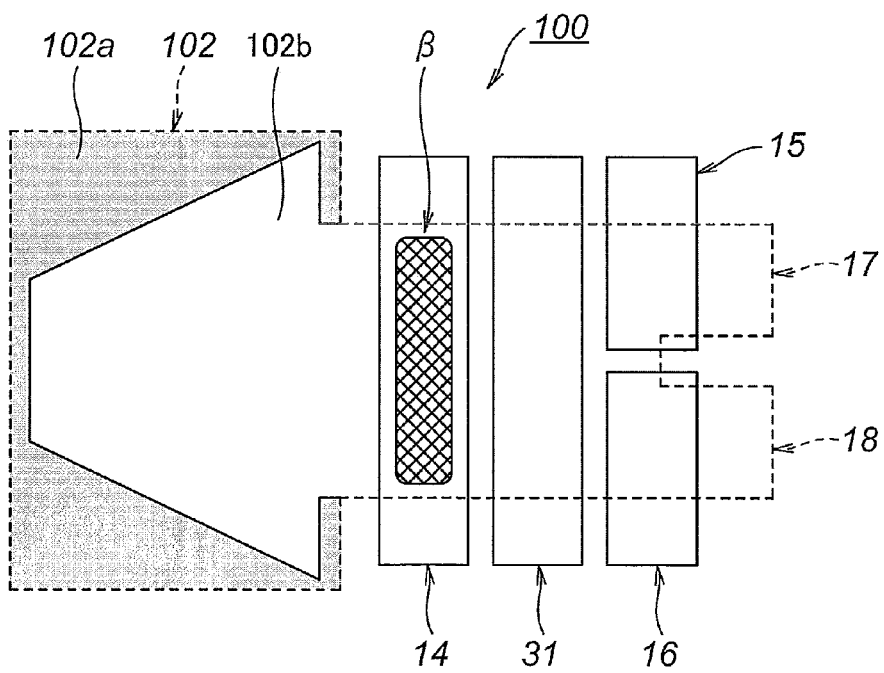

Then, in the vicinity of the read-out gate 14, when a voltage is applied to the read-out gate 14 and a channel is formed directly under the gate, gradient of potential is formed in the photodiode 102, so that electrons are collected in the channel directly under the read-out gate 14 in very short time (a few tens of nanoseconds, for example). More specifically, electrons intensively move to a shaded region shown by a numerical character β in FIG. 11(b).

As described above, according to the pixel structure 100, the structure of the photodiode 102 narrows a potential well where electrons could exist proportional to distance from the read-out gate 14 being the first-stage gate, and thus, gradient on which electrons naturally move to the read-out gate 14 direction being the first-stage gate is formed on the potential, electrons naturally move from the peripheral area to the center of the photodiode 102, and then to an area near the read-out gate 14, and the number of residual electrons in the photodiode 102 can be significantly reduced.

Herein, description will be made for a manufacturing method of the photodiode 102, in which an element is generally formed in a CMOS process in the order of ion dope to substrate bedding, forming oxide film, forming polysilicon gate, and forming source/drain by high-concentration ion implantation.

In the photodiode 102 according to the present invention, the structure of photodiode can be formed by the general process described above.

Meanwhile, it is necessary to create many masks in manufacturing the photodiode 102, because an actual semiconductor process goes through multistage complicated processes, but description will be made here for two primary masks and structures only.

Figure 12A:
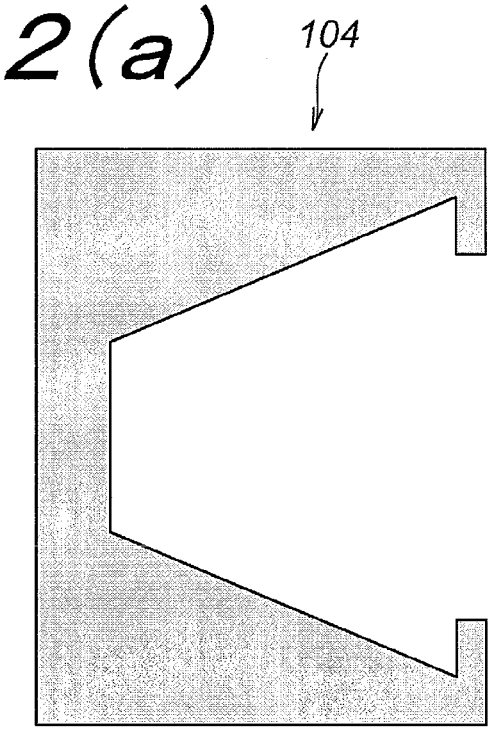
FIG. 12(a) is a mask for forming the PW layer of the photodiode on a substrate on which epitaxial layer is formed.

More specifically, P type ion is implanted deep, that is, 6 μm or more for example, by a mask 104 (refer to FIG. 12(a)) for forming the PW layer 102a of the photodiode 102 on the substrate 11 on which epitaxial layer is formed.

As a result, the structure of the PW layer 102a (refer to FIG. 10(a)) so as to sterically surround the outside of a trapezoid is formed.

Practically, ion concentration on the boundary has reasonable gradient due to diffusion of annealing and is not clear boundary as shown in the drawing, but the blur does not cause any disadvantage to the present invention.

Then, after silicon oxide film and a polysilicon gate are formed by going through several steps of semiconductor process, N type ion implantation is performed to form the N-layer 102b of the photodiode 102.

Figure 12B:
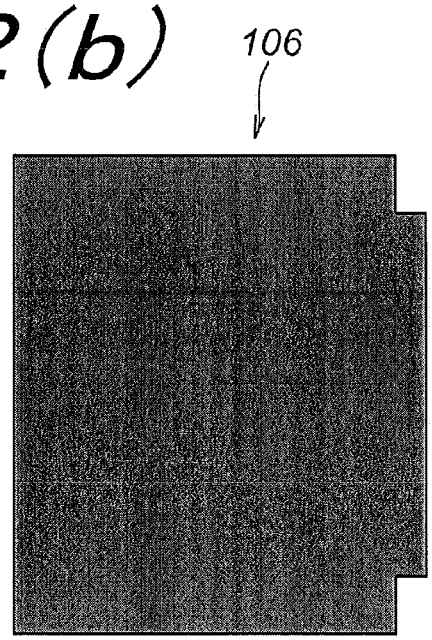
FIG. 12(b) is a mask for forming the N-layer of the photodiode.

A mask 106 used at that time is equipped with the shape as shown in FIG. 12(b). Herein, the right end of the mask 106 in FIG. 12(b) is actually self-alignment of the polysilicon gate.

Further, the ion implantation is aimed at the depth of 2 to 4.5 μm for example, N type ion concentration to be implanted is higher than the ion concentration of the PW layer 102a by about a single digit, so that the photodiode 102 after implantation becomes the solid structure as shown in FIG. 10(c).

More specifically, a shape in which the square N-layer 102b is stacked on the PW layer 102a from which a trapezoid is cut out is built.

2. Second Embodiment and Third Embodiment

Embodiment to Solve Problem 2: Method of Improving a State where Electron Transfer to the Distribution Gate Becomes Uncertain)

In the second embodiment, transferred electrons are intensively moved to an area near the boundary of a pair of the distribution gates being the third-stage gates, and conditions on which the distribution gates efficiently perform distribution operation of electrons are arranged.

Further, in the third embodiment, possibility that electrons can be moved from one of a pair of the distribution gates being the third-stage gates to the other one is secured, and possibility that electrons are trapped to the closed distribution gate side is eliminated.

More specifically, two methods are effective in improving the state where electron transfer to the distribution gate becomes uncertain.

One of these two methods is the method shown as the second embodiment, in which transferred electrons are intensively moved to an area near the boundary of the distribution gate, conditions on which the distribution gate efficiently performs distribution operation of electrons are arranged, and possibility of occurring biased distribution is eliminated.

Further, the other one of these two methods is the method shown as the third embodiment, in which possibility that electrons can move from one of a plurality of the distribution gates to another is secured, and possibility that electrons are trapped to the closed gate side is eliminated.

Figure 13A:
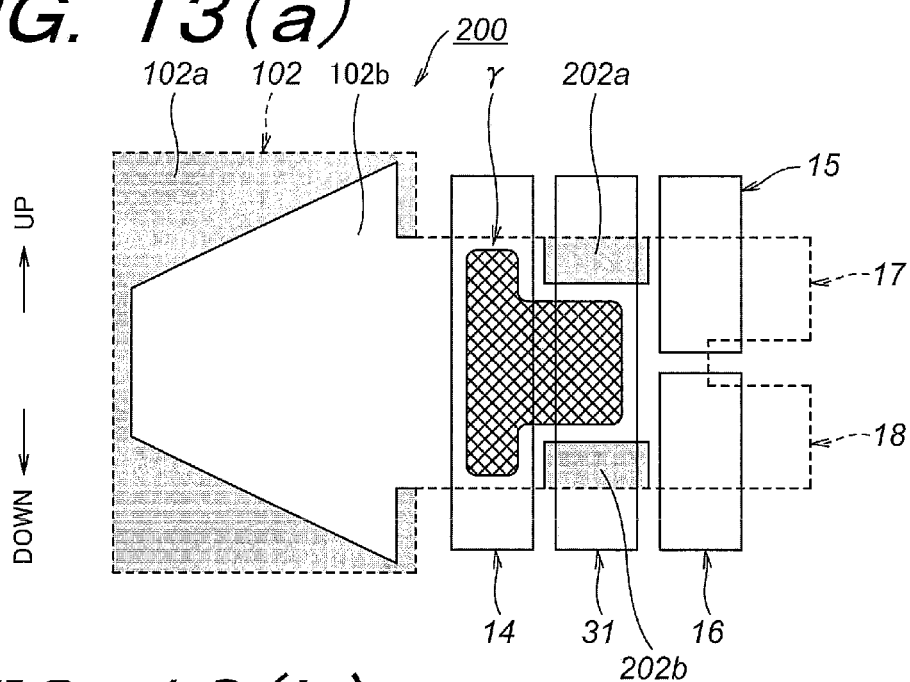
FIGS. 13(a) (b) are plane structure explanatory views schematically illustrating a principled plane structure of the pixel structure of a solid-state image sensor according to the second embodiment of the present invention.

FIG. 13(a) show the plane structure explanatory view schematically illustrating a principled plane structure of the pixel structure of a solid-state image sensor according to the second embodiment.

Figure 13B:
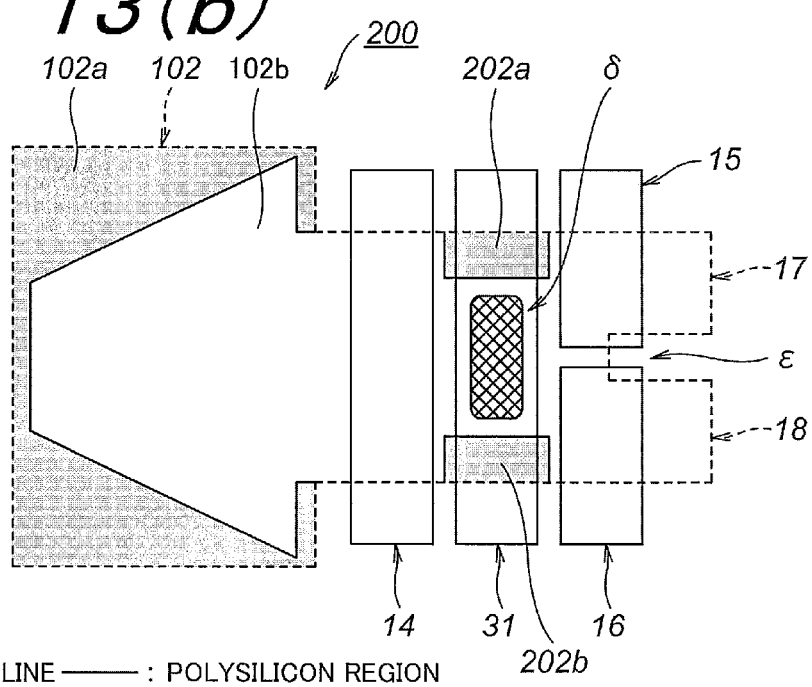

More specifically, the pixel structure 200 of a solid-state image sensor according to the second embodiment is different from the pixel structure of a solid-state image sensor according to the first embodiment 100 on the point that PW layers (202a, 202b) composed of the P type impurity middle-concentration doped region, whose P type impurity concentration is increased by about a single digit comparing to the P type impurity low-concentration doped region that constitutes the substrate 11, are formed on the both end portions directly under the movement gate 31 in vertical directions on FIG. 13. These PW layers (202a, 202b) are equipped with a square shape in planar view.

Herein, it is known that a gate threshold value is high when the P type impurity concentration directly under the gate is high and the gate threshold value is low when the P type impurity concentration is low.

Generally, a threshold value of an N channel gate directly arranged on the epitaxial layer of a substrate having low P type impurity concentration becomes almost zero or slight depression, and a threshold value of the N channel gate above the P well having higher P type impurity concentration than that of the epitaxial layer becomes enhancement and a positive voltage is required to open the gate.

As shown in FIG. 13(a), in the case where the P type impurity concentration changes directly under the gate, a channel through which electrons pass tends to be formed in a region near the center of the gate having low P type impurity concentration, and on the other hand, a channel through which electrons pass is hard to be formed in the PW layers (202a, 202b) having high P type impurity concentration at the both ends in vertical directions of FIG. 13(a).

Therefore, when a voltage is applied to the read-out gate 14 and the movement gate 31, electrons spread in a channel formed directly under each gate, but electrons move intensively to the central area because the PW layers (202a, 202b) have high gate threshold values. More specifically, electrons move intensively to a shaded region shown by numerical character γ in FIG. 13(a).

Next, since the channel directly under the read-out gate 14 disappears when the voltage of the read-out gate 14 is returned, electrons are pushed out and move intensively to an area directly under the center of the movement gate 31. More specifically, electrons move intensively to a shaded region shown by numerical character δ in FIG. 13(b).

Herein, since Problem 2 is a phenomenon that becomes a problem when electrons move from an area near the edge of the movement gate 31 to the opposite side, it can be solved by forming the PW layers (202a, 202b) at the both end portions directly under the movement gate 31 in the vertical directions on FIG. 13 and by moving electrons intensively to an area near the boundary ε between the first distribution gate 15 and the second distribution gate 16 which are the third-stage gates, that is, near the center of the movement gate 31.

More specifically, according to the pixel structure 200, transferred electrons can be moved to the area near the boundary ε between the first distribution gate 15 and the second distribution gate 16 being a pair of the distribution gates being the third-stage gates, and thus conditions on which the first distribution gate 15 and the second distribution gate 16 which are a pair of the distribution gates efficiently perform distribution operation of electrons can be arranged.

In short, according to the pixel structure 200, possibility of occurring imbalance distribution in the first distribution gate 15 and the second distribution gate 16 being a pair of the distribution gates that are the third-stage gates can be eliminated, electron transfer from the movement gate 31 being the second-stage gate to a pair of the distribution gates being the third-stage gates can be securely performed.

Figure 14A:
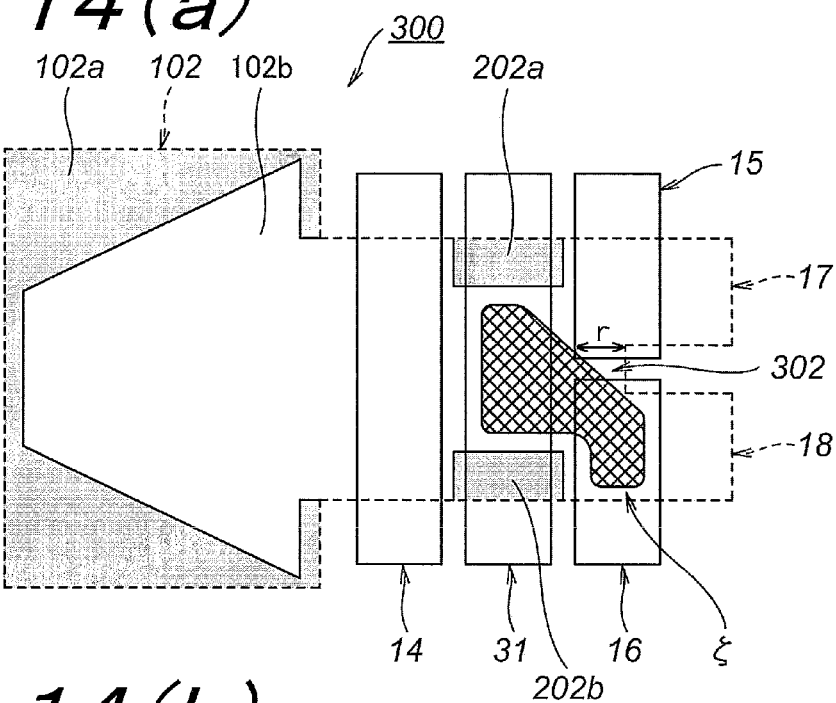
FIGS. 14(a) (b) are plane structure explanatory views schematically illustrating a principled plane structure of the pixel structure of a solid-state image sensor according to the third embodiment of the present invention.

Next, FIG. 14(a) shows the plane structure explanatory view schematically illustrating a principled plane structure of the pixel structure of a solid-state image sensor according to the third embodiment.

More specifically, in the pixel structure 300 of the solid-state image sensor according to the third embodiment, a narrow channel region 302 is formed around the boundary $\epsilon$ between the first distribution gate 15 and the second distribution gate 16 being a pair of the distribution gates that are the third-stage gates (although explanation was omitted, the state where the channel region 302 is formed is illustrated also in the first embodiment and the second embodiment for convenience sake of illustration).

Meanwhile, as the size of layout in planar view, the following is preferable.

Dimension r: about half Dimension f, that is, 30 to 70% of Dimensions f, for example 0.15 to 1.05 μm if Dimension f is 0.5 to 1.5 μm Therefore, in the pixel structure 300, by providing the narrow channel region 302 around the boundary $\epsilon$ between the first distribution gate 15 and the second distribution gate 16 being a pair of the distribution gates that are the third-stage gates, a linear movement route of electrons is created continuously from the area directly under the movement gate 31 to the distribution gate on the side to which a voltage was applied.

More specifically, in the case where a voltage is applied to the second distribution gate 16, electrons exist in a shaded region shown by numerical character 4 in FIG. 14(a), and a smooth movement route of electrons is thus created.

Figure 14B:
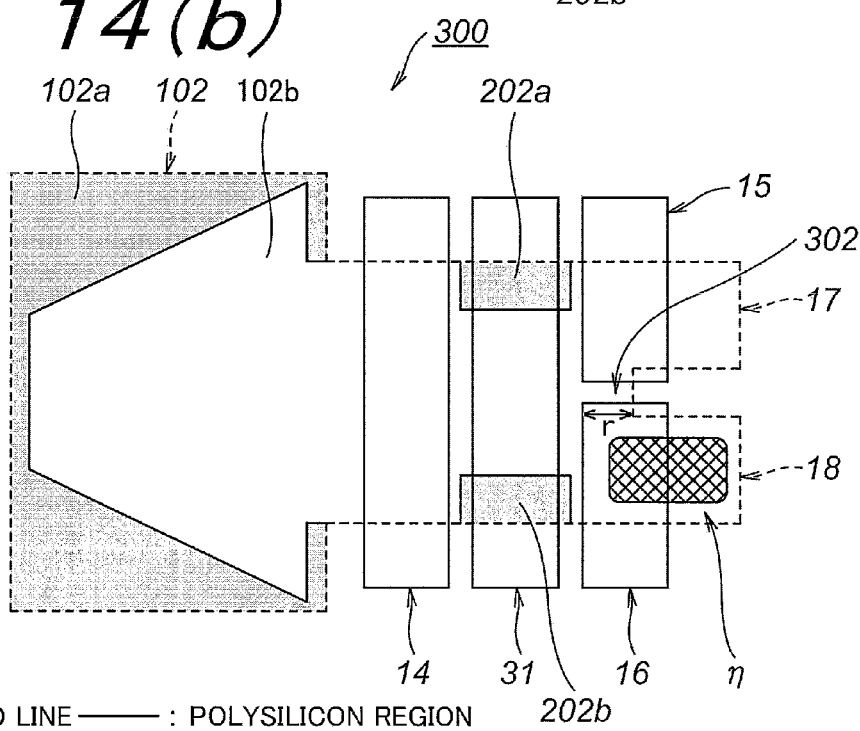

Then, when the applied voltage of the movement gate 31 is set to zero in the next moment, electrons are expelled from the channel directly under the movement gate 31 and move directly under the second distribution gate 16, but in the case where the potential of the second charge-storage section 18 is low, electrons do not stay directly under the second distribution gate 16, move to the second charge-storage section 18 and stored. More specifically, electrons are stored in a shaded region shown in numerical character η in FIG. 14(b).

It is preferable to set the P type impurity concentration of the substrate 11 directly under the first distribution gate 15 and the second distribution gate 16 to a slightly higher level due to separation of the first charge-storage section 17 and the second charge-storage section 18.

More specifically, in the pixel structure 300, because the narrow channel region 302 was formed around the boundary $\epsilon$ between the first distribution gate 15 and the second distribution gate 16 being a pair of the distribution gates that are the third-stage gates, possibility that electrons can be moved from one of the pair of the distribution gates to the other one is secured, and possibility that a voltage is not applied and electrons are trapped to a closed distribution gate side can be eliminated.

Therefore, according to the pixel structure 300, electron transfer from the movement gate 31 being the second-stage gate to the first distribution gate 15 or the second distribution gate 16 being a pair of the distribution gates that are the third-stage gates can be securely performed.

3. Fourth Embodiment

Embodiment to Solve Problem 3: Method of Improving Imbalance Due to Manufacturing Accuracy (Error)

Generally, it is mask accuracy, exposure positional accuracy or the like that covers manufacturing accuracy various element, which is complicated, and it is known that variation is lightened in symmetrically arranged elements.

This fourth embodiment is that a plurality of pixel structures are symmetrically arranged and connected in parallel as shown in FIG. 15 to solve Problem 3.

More particularly, a pixel structure 400 of a solid-state image sensor according to the fourth embodiment shown FIG. 15 is constituted by using the pixel structure 300 as a basic constituent unit and using four of the basic constituent units. Specifically, the four pixel structures 300 being four basic constituent units are symmetrically arranged and the four pixel structures 300 being the four basic constituent units are connected in series.

More specifically, in FIG. 15, the areas shown by the same numeric characters in the drawing should be connected to each other by using metal wire (not shown) the total of two pairs, that is, the four pixel structures 300 in total are connected in parallel.

This layout is symmetrical in planar view both horizontally and vertically, imbalance electron distribution originated from manufacturing accuracy is neutralized.

4. Experiment Result

Figure 16:
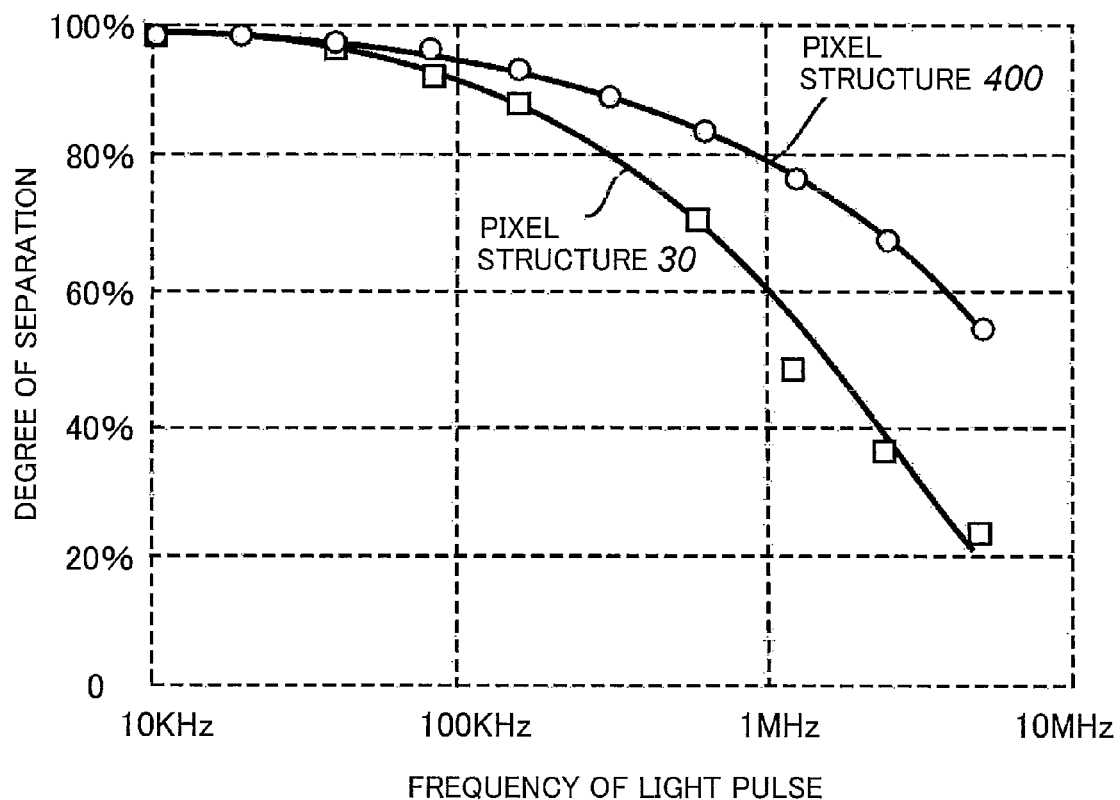
FIG. 16 is a graph showing the experiment result by the present inventor.

FIG. 16 illustrates the graph showing the result of experiment conducted by the present inventor, and the present inventor conducted comparative experiment by using the pixel structure 30 and the pixel structure 400.

In the experiment, an LED that emits pulsed light at high frequency was used as a light source, and light from the light source was irradiated on the pixel structure 30 and the pixel structure 400.

Meanwhile, in conducting the experiment, an image sensor was prototyped by using the CMOS (P1-M6) process for CIS use having 0.18 μm, and performance was evaluated. In both cases, the size of one photodiode was set to 4.5 μm squares.

Herein, the axis of ordinate of the graph shown in FIG. 16 represents the degree of separation, which is a difference of voltage output proportional to the number of electrons that were distributed and stored in two charge-storage sections (the first charge-storage section 17 and the second charge-storage section 18) at the timing of voltage application. It is to be noted that 100% means that all electrons are collected by the charge-storage section (the first charge-storage section 17 or the second charge-storage section 18) on the side of the distribution gate (the first distribution gate 15 or the second distribution gate 16) to which voltage was applied synchronously with light emission and electrons are not stored at all in the charge-storage section on the distribution gate side to which a voltage was applied in opposite phase.

On the other hand, the axis of abscissas of the graph shown in FIG. 16 represents the frequency of light pulse irradiated on the pixel structure 30 and the pixel structure 400, and measurement was done between 10 KHz to 5 MHz.

Further, in the graph shown by FIG. 16, "□" shows the measurement result of the pixel structure 30, and "○" shows the pixel structure 400 measurement result.

Referring to the graph shown in FIG. 16, difference between the both is not remarkable in the frequency of light pulse from 10 KHz to 100 KHz, but separating performance deteriorate in the pixel structure 30 due to the influence of residual electrons in higher frequency.

Meanwhile, in the pixel structure 30, 30% or more of large imbalance of electron distribution was observed in 100 or more of pixels out of approximately 1000 pixels measured, but the pixel structure 400 did not have any pixel having 20% or more of distribution imbalance, and average deviation fell within 5%.

5. Modified Example

It is to be noted that the each embodiment may be modified as described in (1) to (3) below.

(1) In each embodiment above, the shape of the PW layer 102a of the photodiode 102 was equipped with the space of a trapezoidal shape whose bottom is positioned on the read-out gate 14 side in planar view, but it goes without saying that the invention is not limited to this.

Figure 17A:
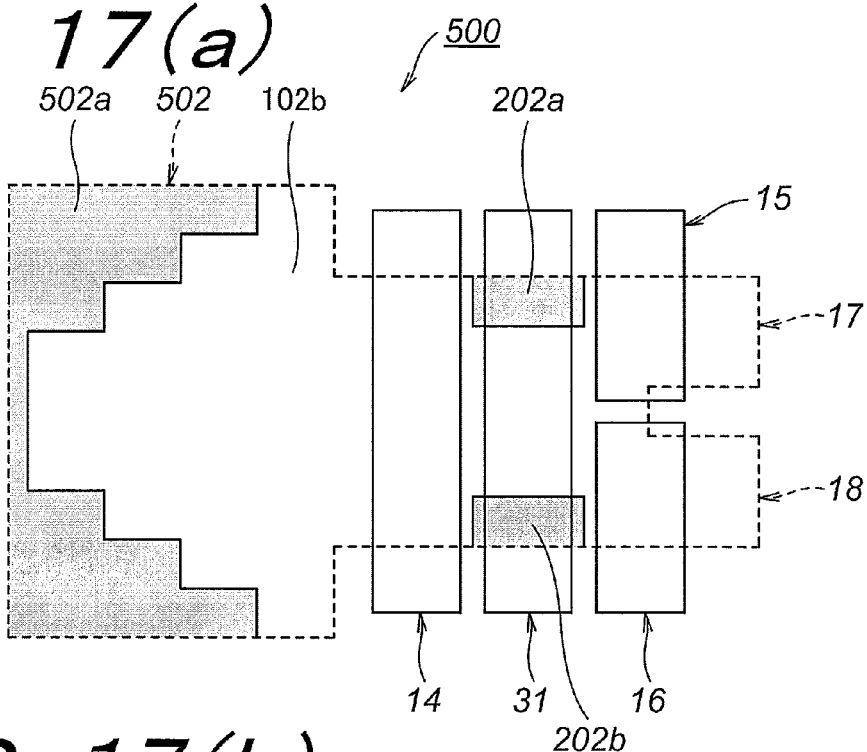
FIGS. 17(a) (b) are plane structure explanatory views schematically illustrating a principled plane structure of the pixel structure of a solid-state image sensor according to the modified example of each embodiment of the present invention.

For example, as a pixel structure 500 shown in FIG. 17(a), a PW layer 502a whose boundary is formed in a square shape, that is, in a step-like shape may be used as a photodiode 502.

In short, in each embodiment above, the PW layer 102a is in a trapezoidal shape using diagonal lines in planar view, its shape may not be a trapezoidal shape because the PW layer 102a should only be formed such that electrons are hard to exist at end portions away from the read-out gate 14 of the photodiode 102.

Therefore, even if the boundary is formed in a square shape such as the PW layer 502, the region of the substrate 11 at the end portions away from the read-out gate 14 of the photodiode 102 can be narrowed, and thus it becomes possible to prevent electrons from existing at the end portions away from the read-out gate 14 of the photodiode 102.

Further, in each embodiment above, the PW layers (202a, 202b) directly under the movement gate 31 were equipped with a square shape in planar view, it goes without saying that the invention is not limited to this.

Figure 17B:
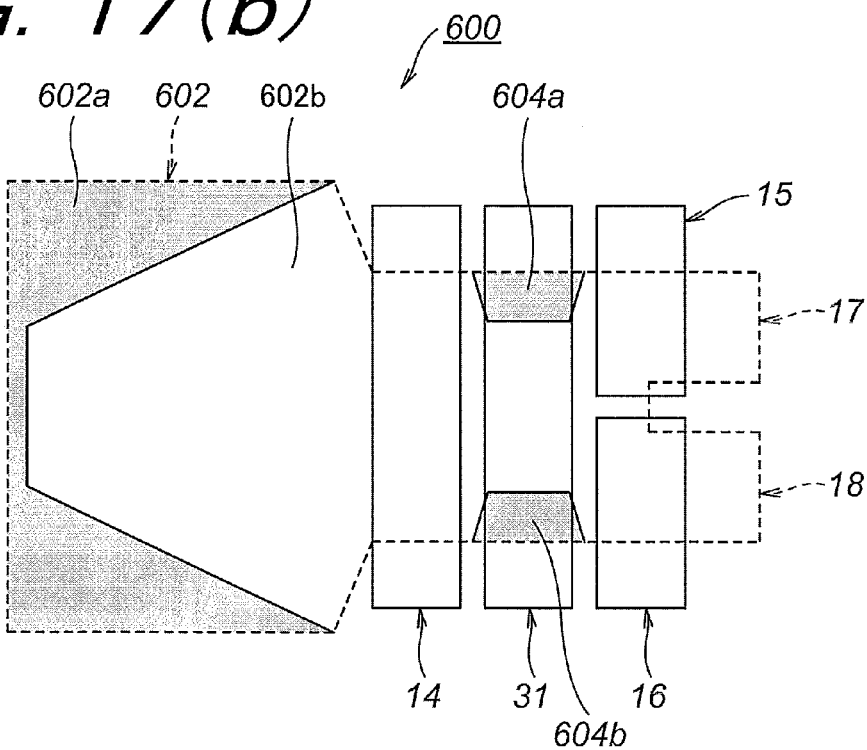

For example, such as a pixel structure 600 shown in FIG. 17(b), PW layers (604a, 604b) of a trapezoidal shape may be provided directly under the movement gate 31.

Further, as photodiode 602 of the pixel structure 600, it is formed by equipping PW layer 602a, in which boundary is formed in a trapezoidal shape, and an N-layer 602b having a narrowed shape toward the read-out gate 14.

(2) The second embodiment described the case equipped with the constitution to solve Problem 1 according to the first embodiment, but it goes without saying that the invention is not limited to this, and only the constitution to solve Problem 2 according to the second embodiment may be equipped without the constitution to solve Problem 1 according to the first embodiment.

Similarly, the third embodiment described the case equipped with the constitution to solve Problem 1 according to the first embodiment or the constitution to solve Problem 2 according to the second embodiment, but it goes without saying that the invention is not limited to this, and only the constitution to solve Problem 2 according to the third embodiment may be equipped without the constitution to solve Problem 1 according to the first embodiment or the constitution to solve Problem 2 according to the second embodiment, and only one of the constitution to solve Problem 1 according to the first embodiment and the constitution to solve Problem 2 according to the second embodiment may be equipped together with the constitution to solve Problem 2 according to the third embodiment.

Moreover, the same applies to the fourth embodiment, in which only the constitution to solve Problem 3 according to the fourth embodiment may be equipped without the constitution to solve Problem 1 or Problem 2, or the constitution to solve Problem 3 according to the fourth embodiment may be equipped together with an arbitrary constitution out of the constitutions to solve Problem 1 and Problem 2.

More specifically, in the fourth embodiment, the pixel structure 30 is used as a basic constituent unit, a plurality of the pixel structures 30 being the basic constituent units are used, a plurality of the pixel structure 30 being the plurality of basic constituent units are symmetrically arranged and a plurality of the pixel structures 30 being the plurality of basic constituent units may be connected in parallel.

Meanwhile, in the fourth embodiment, the neutralizing the imbalance of a gate threshold value and correctly distributing electrons do not necessarily match.

For example, in the case where the gate threshold values of the distribution gates being the third-stage gates are excessively imbalanced and the distribution of electrons has imbalance, opposite imbalance occurs in the pixel structures of symmetrical arrangement, and imbalance of the gate threshold values is neutralized.

This neutralization averages imbalance and apparent imbalance can be improved, but the degree of separation is deteriorated.

More specifically, to solve Problem 3, the four pixel structures 300 are symmetrically arranged in the fourth embodiment, and what is improved in this symmetrical arrangement is mainly making capacitance of the charge-storage sections (the first charge-storage section 17 and the second charge-storage section 18) equal, and laying metal wirings with good symmetry to apply an equal voltage to each gate wire (particularly, distribution gate) at equal timing on the entire arrangement.

On the other hand, to resolve Problem 3 more effectively, it is preferable to improve distribution performance by equipping the constitutions to solve Problem 1 and Problem 2, and at the same time, as disclosed in Patent Application No. 2007-181696, forming larger potential gradient than the threshold value variation in the distribution gate to securely perform transfer from the second-stage the movement gate 31 to the third-stage the distribution gate.

In short, although effect can be expected to a certain extent by singularly applying the method of solving each Problem 1, Problem 2 and Problem 3, it is preferable to apply all methods by combining them within a range where they do not interfere to each other.

(3) In the embodiments above, specific dimensional values and the like were shown for easier understanding of the present invention, these numerical values are merely an example, and it goes without saying that they may be appropriately changed in response to design conditions or the like.

(4) The embodiments above and the modified examples shown in (1) to (3) may be appropriately combined.

It will be appreciated by those of ordinary skill in the art that the present invention can be embodied in order specific forms without departing from the spirit or essential characteristics thereof.

The presently disclosed embodiments are therefore considered in all respects to be illustrative and not restrictive. The scope of the invention is indicated by the appended claims rather than the foregoing description, and all changes that come within the meaning and range of equivalents thereof are intended to be embraced therein.

The entire disclosure of Japanese Patent Application No. 2008-125309 filed on May 12, 2008 including specification, claims, drawings and summary are incorporated herein by reference in its entirety.

The invention claimed is:

1. A pixel structure of a solid-state image sensor employing a charge sorting method that distributes electrons generated by photoelectric conversion to perform charge storage, said structure comprising:
   a photodiode that generates electrons by photoelectric conversion;
   a plurality of charge-storage sections that store electrons generated in said photodiode; and
   a gate structure
      that is arranged between said photodiode and said charge-storage sections and
      controls transfer of electrons generated in said photodiode to said plurality of the charge- storage sections,
   wherein
   said gate structure is made up of three stages of gates,
   said three stages of gates have:
      a first-stage gate
         that is arranged adjacent to said photodiode
         on the rear stage of the photodiode and
         controls read-out of electrons generated in said photodiode;
      a second-stage gate
         that is adjacent to said first-stage gate
         on the rear stage of the gate
         at a predetermined gap and
         controls moving of electrons read out by the readout control of said first-stage gate to said plurality of the charge-storage sections; and
      a third-stage gate constituted of a plurality of distribution gates that
         are adjacent to said second-stage gate on the rear stage of the gate at a predetermined gap,
         severally arranged corresponding to said plurality of the charge-storage sections, and
         perform control of distributing the electrons moved by the movement control of said second-stage gate severally to said plurality of the charge-storage sections,
   wherein said photodiode comprises
      a P-type impurity middle-concentration doped region
         having a shape in planar view of a square region from which a trapezoid is cut out and
         having an edge positioned adjacent to the trapezoid and the first-stage gate side in planar view, and
      an N-type impurity low-concentration doped region
         having a square shape
         which is stacked on the P-type impurity middle-concentration doped region, and
   wherein electrons from the photodiode are moved in the vicinity of said first stage gate by generating a gradient on the potential of said photodiode.

2. The pixel structure of a solid-state image sensor employing a charge sorting method according to claim 1, wherein
   said photodiode is formed so as to narrow a potential well in which electrons could exist proportional to distance from said first-stage gate.

3. The pixel structure of a solid-state image sensor employing a charge sorting method according to claim 2, wherein
   a substrate impurity doping concentration directly under the end portion of said photodiode on the opposite side of said first-stage gate side and a peripheral area of said photodiode is increased, and the potential well of said photodiode is allowed to unevenly exist at the central portion of said photodiode and in the vicinity of said first-stage gate.

4. The pixel structure of a solid-state image sensor employing a charge sorting method according to claim 1,
   wherein said second-stage gate
      is provided on a substrate and
      covers a channel region of the substrate comprising a P-type impurity concentration and P well regions having a higher P-type impurity doping concentration than remaining portions of the channel region;
   wherein
      the P wells resist an inversion while
      the remaining portions of the channel region invert
      when a gate voltage is applied to the second stage gate
      such that
   said second-stage gate
      allows electrons to intensively move to an area directly under the central portion of said second-stage gate and
      controls the movement of electrons to an area near the boundaries of said plurality of the third-stage gates when a voltage is applied to said first-stage gate and said second-stage gate.

5. The pixel structure of a solid-state image sensor employing a charge sorting method according to claim 1, wherein
   a region
      having a low substrate impurity doping concentration
      is provided directly under the boundary between each distribution gate in said plurality of the third-stage gates, and
   a channel
      being a moving route of electrons is formed when a voltage is applied to said distribution gates.

6. The pixel structure of a solid-state image sensor employing a charge sorting method according to claim 1,
   wherein said second-stage gate
      is provided on a substrate and
      covers a channel region of the substrate comprising a P-type impurity concentration and P well regions having a higher P-type impurity doping concentration than remaining portions of the channel region;
   wherein
      the P wells resist an inversion while
      the remaining portions of the channel region invert
      when a gate voltage is applied to the second stage gate
      such that
   said second-stage gate
      allows electrons to intensively move to an area directly under the central portion of said second-stage gate and
      controls the movement of electrons to an area near the boundaries of said plurality of the third-stage gates when a voltage is applied to said first-stage gate and said second-stage gate; and
   a region
      having a low substrate impurity doping concentration
      is provided directly under the boundary between each distribution gate in said plurality of the third-stage gates, and
   a channel
      being a moving route of electrons is formed when a voltage is applied to said distribution gates.

7. The pixel structure of a solid-state image sensor employing a charge sorting method according to claim 1, wherein
   a pixel structure of said solid-state image sensor is a basic constituent unit, and four of said basic constituent units are used, said four basic constituent units are symmetrically arranged in vertical and horizontal directions into two pairs, said four basic constituent units are connected in series, and arranged to lighten imbalance of electrons distribution.

8. A pixel structure of a solid-state image sensor employing a charge sorting method that distributes electrons generated by photoelectric conversion to perform charge storage, said structure comprising:
   a substrate;
   a photodiode in said substrate that generates electrons by photoelectric conversion;
   a plurality of charge-storage sections that store electrons generated in said photodiode; and
   a gate structure on said substrate
      that is arranged between said photodiode and said charge-storage sections and
      controls transfer of electrons generated in said photodiode to said plurality of the charge-storage sections, wherein
   said gate structure is made up of three stages of gates,
   said three stages of gates have:
      a first-stage gate
         that is arranged adjacent to said photodiode and controls read-out of electrons generated in said photodiode;
      a second-stage gate
         that is adjacent to said first-stage gate on the rear stage of the gate at a predetermined gap,
         covers a channel region of the substrate comprising a P-type impurity concentration and P well regions having a higher P-type impurity doping concentration than remaining portions of the channel region, and
         controls moving of electrons read out by the readout control of said first-stage gate to said plurality of the charge-storage sections; and
      a third-stage gate constituted of a plurality of distribution gates
         that are adjacent to said second-stage gate on the rear stage of the gate at a predetermined gap,
         severally arranged corresponding to said plurality of the charge-storage sections, and
         perform control of distributing the electrons moved by the movement control of said second-stage gate severally to said plurality of the charge-storage sections,
   wherein
      the P wells resist an inversion while
      the remaining portions of the channel region invert when a gate voltage is applied to the second stage gate such that
   said second-stage gate
      allows electrons to intensively move to an area directly under the central portion of said second-stage gate and
      controls the movement of electrons to an area near the boundaries of said plurality of the third-stage gates,
      when a voltage is applied to said first-stage gate and said second-stage gate, and
   a region of a boundary between said each distribution gate in said third-stage gate is shorter than a gate dimension of said each distribution gate in planar view.

9. The pixel structure of a solid-state image sensor employing a charge sorting method according to claim 8, wherein
   a region having a low substrate impurity doping concentration is provided directly under the boundary between each distribution gate in said plurality of the third-stage gates, and an additional channel being a moving route of electrons is formed when a voltage is applied to said distribution gates, and
   said region which forms said additional channel is between said each distribution gate in said third- stage gate, and is composed of 30-70% length of said dimension of said gate length of said each distribution gate in planar view.

10. The pixel structure of a solid-state image sensor employing a charge sorting method according to claim 8, wherein
   a pixel structure of said solid-state image sensor is a basic constituent unit, and
   four of said basic constituent units are used, said four basic constituent units are symmetrically arranged in vertical and horizontal directions into two pairs, said four basic constituent units are connected in series, and arranged to lighten imbalance of electrons distribution.

* * * * *